(12) United States Patent
Seshita et al.

(10) Patent No.: US 12,142,604 B2
(45) Date of Patent: Nov. 12, 2024

(54) SEMICONDUCTOR DEVICE AND SEMICONDUCTOR SYSTEM INCLUDING ELECTRO STATIC DISCHARGE (ESD) PROTECTIVE DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toshiki Seshita, Kawasaki Kanagawa (JP); Yasuhiko Kuriyama, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 571 days.

(21) Appl. No.: 17/469,819

(22) Filed: Sep. 8, 2021

(65) Prior Publication Data
US 2022/0302103 A1   Sep. 22, 2022

(30) Foreign Application Priority Data
Mar. 17, 2021  (JP) ................. 2021-043381

(51) Int. Cl.
H01L 27/02   (2006.01)

(52) U.S. Cl.
CPC ...... H01L 27/0255 (2013.01); H01L 27/0262 (2013.01)

(58) Field of Classification Search
CPC .................. H01L 27/0255; H01L 27/0262
USPC ...................................................... 257/355
See application file for complete search history.

(56) References Cited

U.S. PATENT DOCUMENTS

| | | | |
|---|---|---|---|
| 4,131,983 A * | 1/1979 | Matzen | H01L 29/7886 438/258 |
| 4,989,057 A | 1/1991 | Lu | |
| 5,610,426 A | 3/1997 | Asai et al. | |
| 6,521,952 B1 * | 2/2003 | Ker | H01L 27/0262 257/350 |
| 2008/0007882 A1 * | 1/2008 | Bernard | H02H 9/046 361/111 |
| 2020/0161469 A1 | 5/2020 | Fukasaku et al. | |

FOREIGN PATENT DOCUMENTS

| | | | |
|---|---|---|---|
| CN | 102593804 | * | 7/2012 |
| CN | 103646945 | * | 3/2014 |
| JP | H108-037284 A | | 2/1996 |
| JP | H11-000008 U | | 1/1999 |
| JP | WO2019/012839 A1 | | 5/2020 |

* cited by examiner

*Primary Examiner* — Sheng-Bai Zhu
(74) *Attorney, Agent, or Firm* — Kim & Stewart LLP

(57) ABSTRACT

According to one embodiment, a first P-type transistor with a gate is coupled to a first node, and a drain is coupled to a second node. A first N-type transistor with a gate is coupled to the first node, and a drain is coupled to the second node. A second P-type transistor with a gate is coupled to the second node, and a drain is coupled to a third node. A second N-type transistor with a gate is coupled to the second node, and a drain is coupled to the third node. The first P-type transistor is smaller than the first N-type transistor. The second N-type transistor is smaller than the second P-type transistor. The second N-type transistor is smaller than the first N-type transistor.

12 Claims, 17 Drawing Sheets

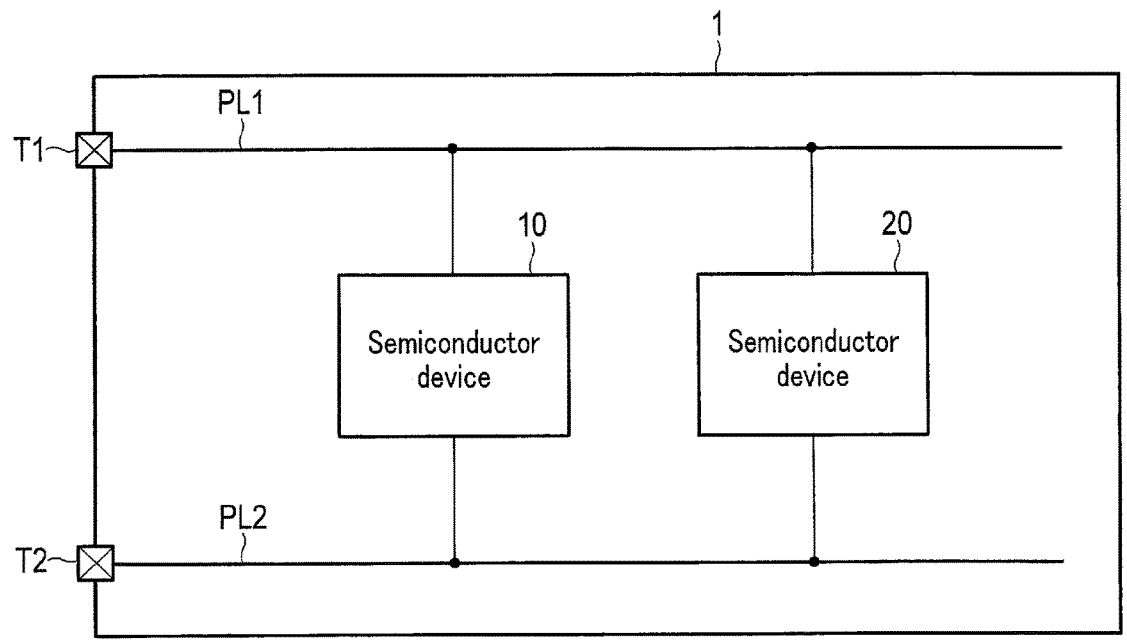
F I G. 1
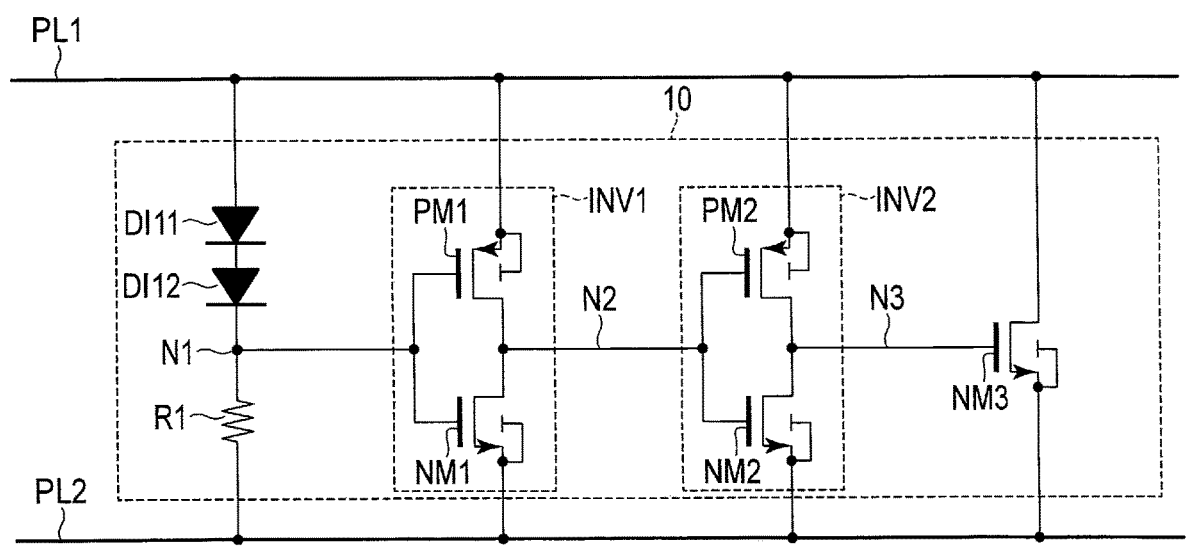
F I G. 2

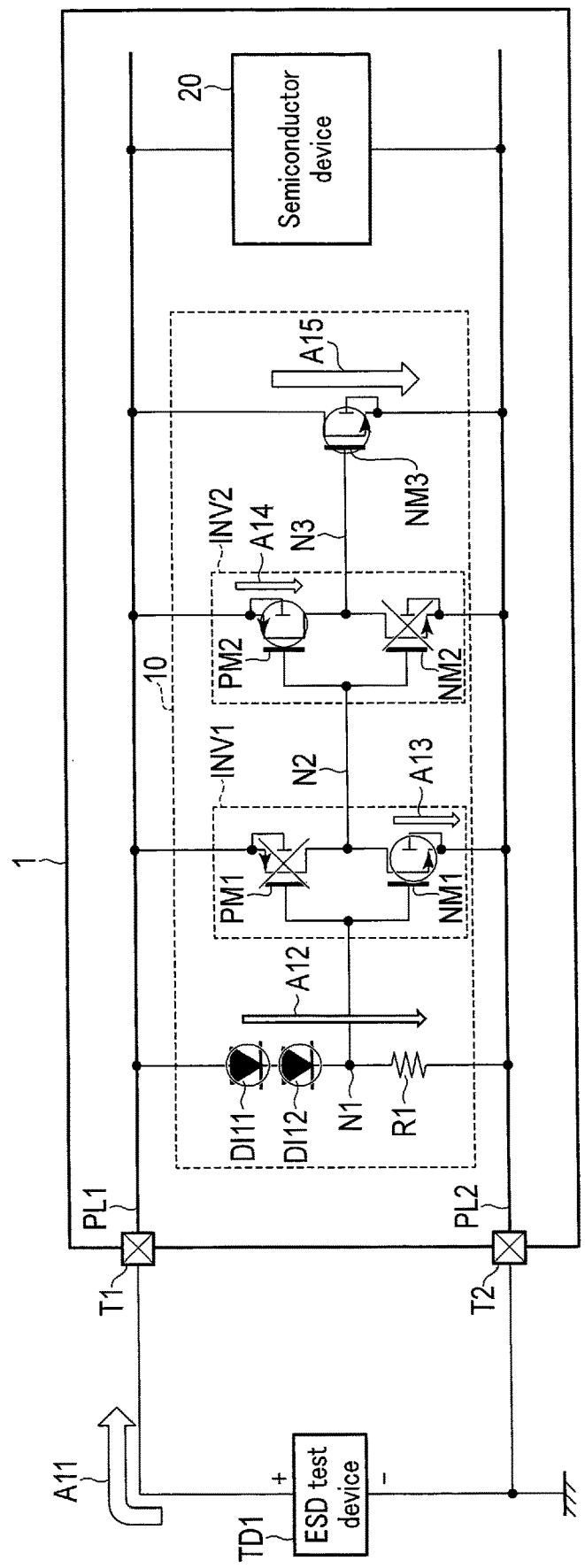
F I G. 8

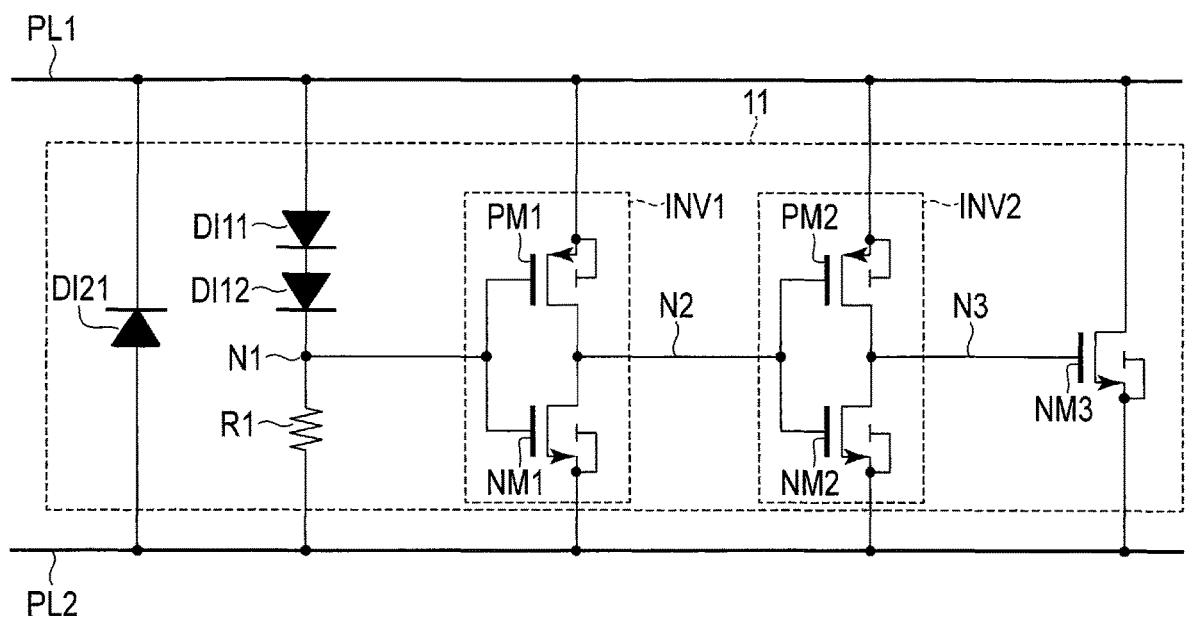
F I G. 9

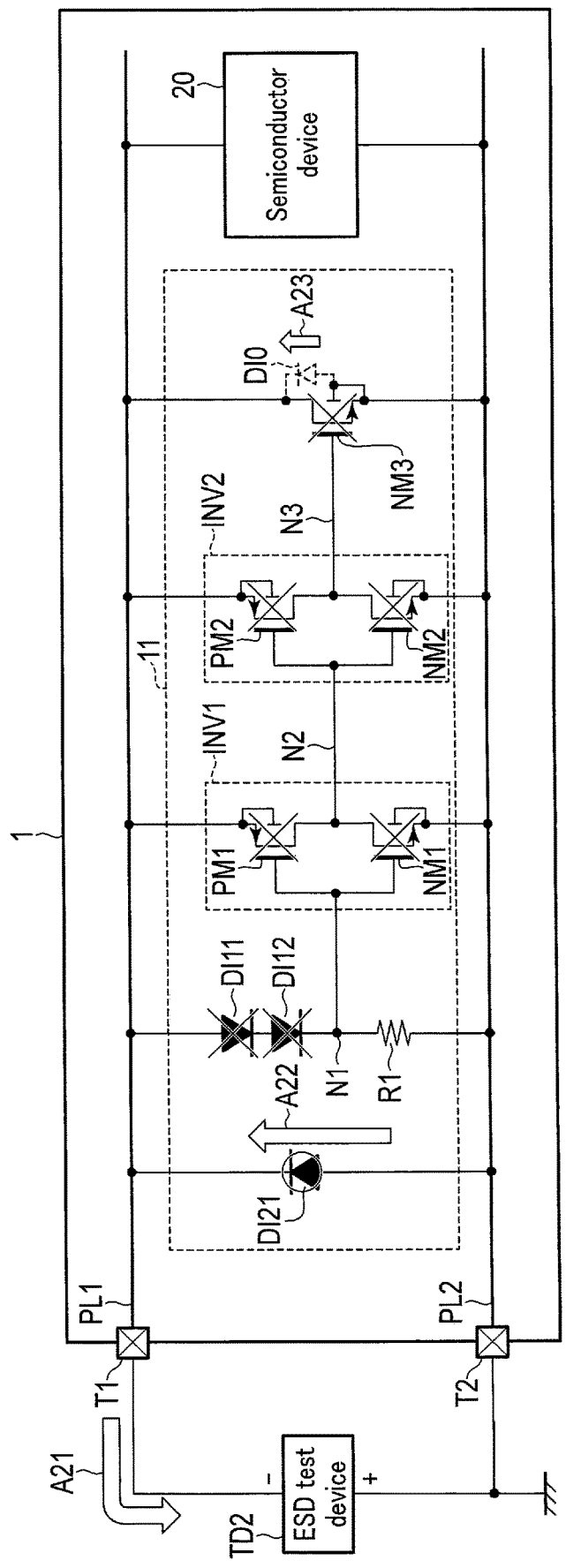
F I G. 10

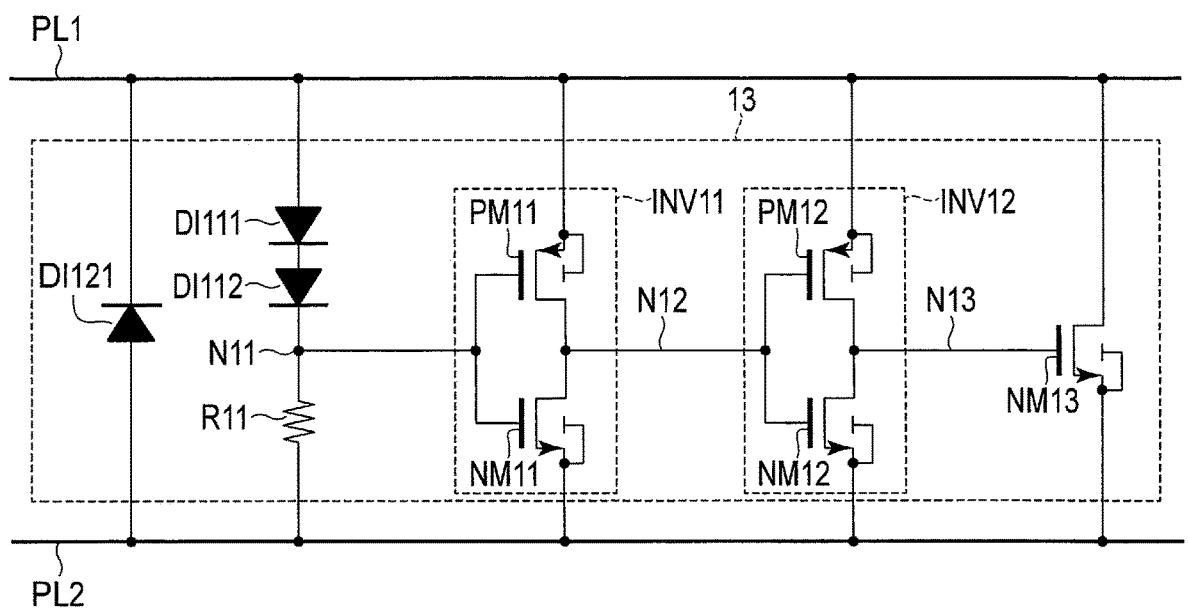
F I G. 13

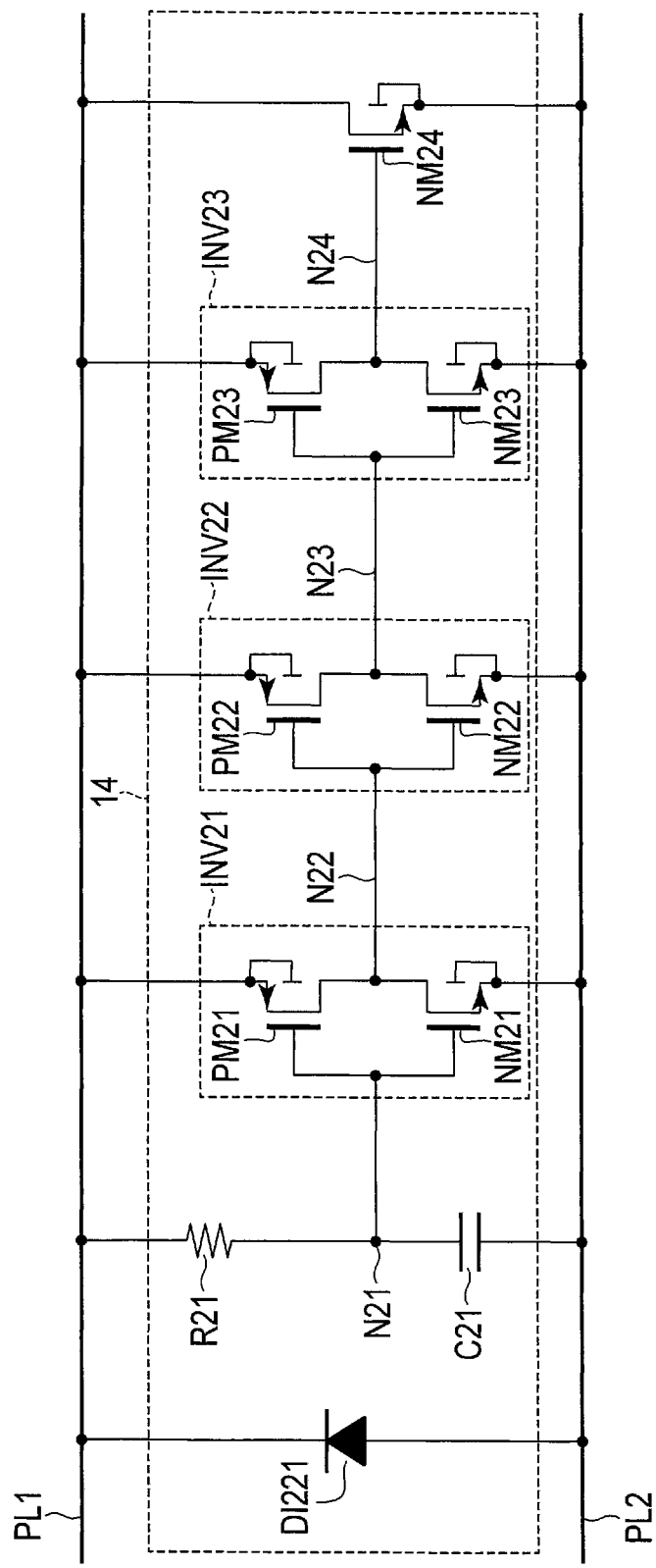
F I G. 14

|  | Vdd_peak (V) | | | | Idd_peak (uA) |
| --- | --- | --- | --- | --- | --- |
|  | HBM +2kV | HBM −2kV | MM +200V | MM −200V | Trise=1us |
| First embodiment | 2.17 | −3.05 | 2.97 | −4.35 | 31 |
| Second embodiment | 2.17 | −1.67 | 2.97 | −2.18 | 31 |
| First comparative example | 2.96 | −1.68 | 3.14 | −2.23 | 28 |
| Second comparative example | 2.95 | −2.07 | 2.97 | −2.07 | 724 |

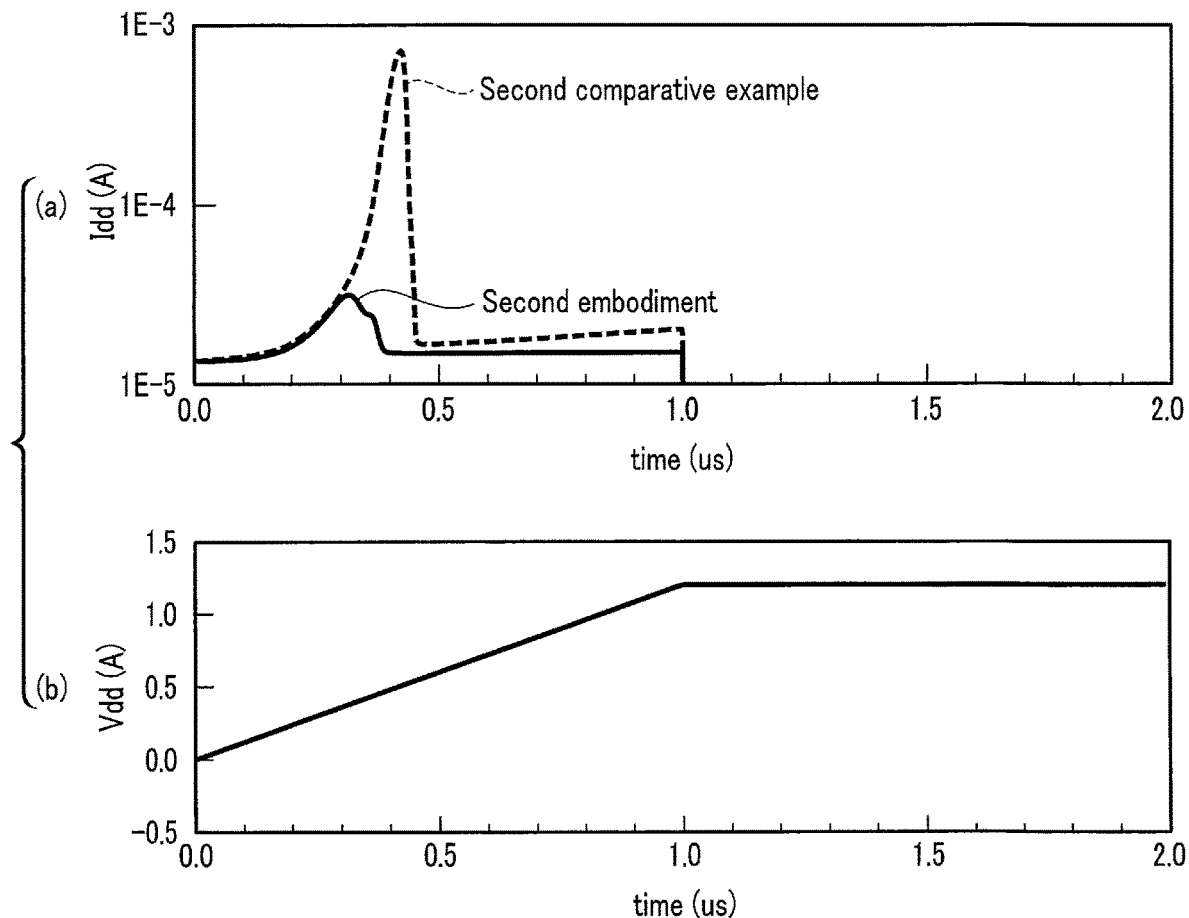
F I G. 20
| Resistance variation ratio | Vdd_peak (V) | | Idd_peak (uA) | |
|---|---|---|---|---|
| | HBM +2kV | | Trise=1us | |
| | Second embodiment | Second comparative example | Second embodiment | Second comparative example |
| 0.9 | 2.18 | 3.34 | 30.8 | 143 |
| 1 | 2.17 | 2.95 | 31.4 | 724 |
| 1.1 | 2.17 | 2.59 | 31.9 | 33127 |
F I G. 21

SEMICONDUCTOR DEVICE AND SEMICONDUCTOR SYSTEM INCLUDING ELECTRO STATIC DISCHARGE (ESD) PROTECTIVE DEVICE

CROSS-REFERENCE TO RELATED APPLICATIONS

This application is based upon and claims the benefit of priority from Japanese Patent Application No. 2021-043381, filed Mar. 17, 2021, the entire contents of which are incorporated herein by reference.

FIELD

Embodiments described herein relate generally to a semiconductor device and a semiconductor system.

BACKGROUND

A protective device that protects against electrostatic discharge (ESD) is known. ESD is a static discharge, and is a phenomenon in which a large current instantaneously flows between two objects at different potentials. When an ESD occurs, a current flows from an object at a high potential to an object at a low potential. The voltage of a node into which a current flows may sharply rise. The voltage of a node out of which a current flows may sharply drop. The protective device functions as a current path when an ESD occurs, and suppresses a sharp voltage rise or drop by discharging charges of the ESD through the current path.

BRIEF DESCRIPTION OF THE DRAWINGS

FIG. 1 is a block diagram showing an example of the configuration of a semiconductor system according to a first embodiment.

FIG. 2 is a circuit diagram showing an example of the circuit configuration of a semiconductor device according to the first embodiment.

FIG. 8 is a schematic view showing an example of an operation performed when a positive ESD is applied to the semiconductor device according to the first embodiment.

FIG. 9 is a circuit diagram showing an example of the circuit configuration of a semiconductor device according to a second embodiment.

FIG. 10 is a schematic view showing an example of the operation performed when a negative ESD is applied to the semiconductor device according to the second embodiment.

FIG. 13 is a circuit diagram showing a circuit configuration of a semiconductor device according to a first comparative example.

FIG. 14 is a circuit diagram showing a circuit configuration of a semiconductor device according to a second comparative example.

FIG. 20 is a diagram showing simulation results of current waveforms when a power supply voltage was applied in the second embodiment and the second comparative example.

FIG. 21 is a table showing simulation results when the resistance value varied in the second embodiment and the second comparative example.

DETAILED DESCRIPTION

Figure 3:
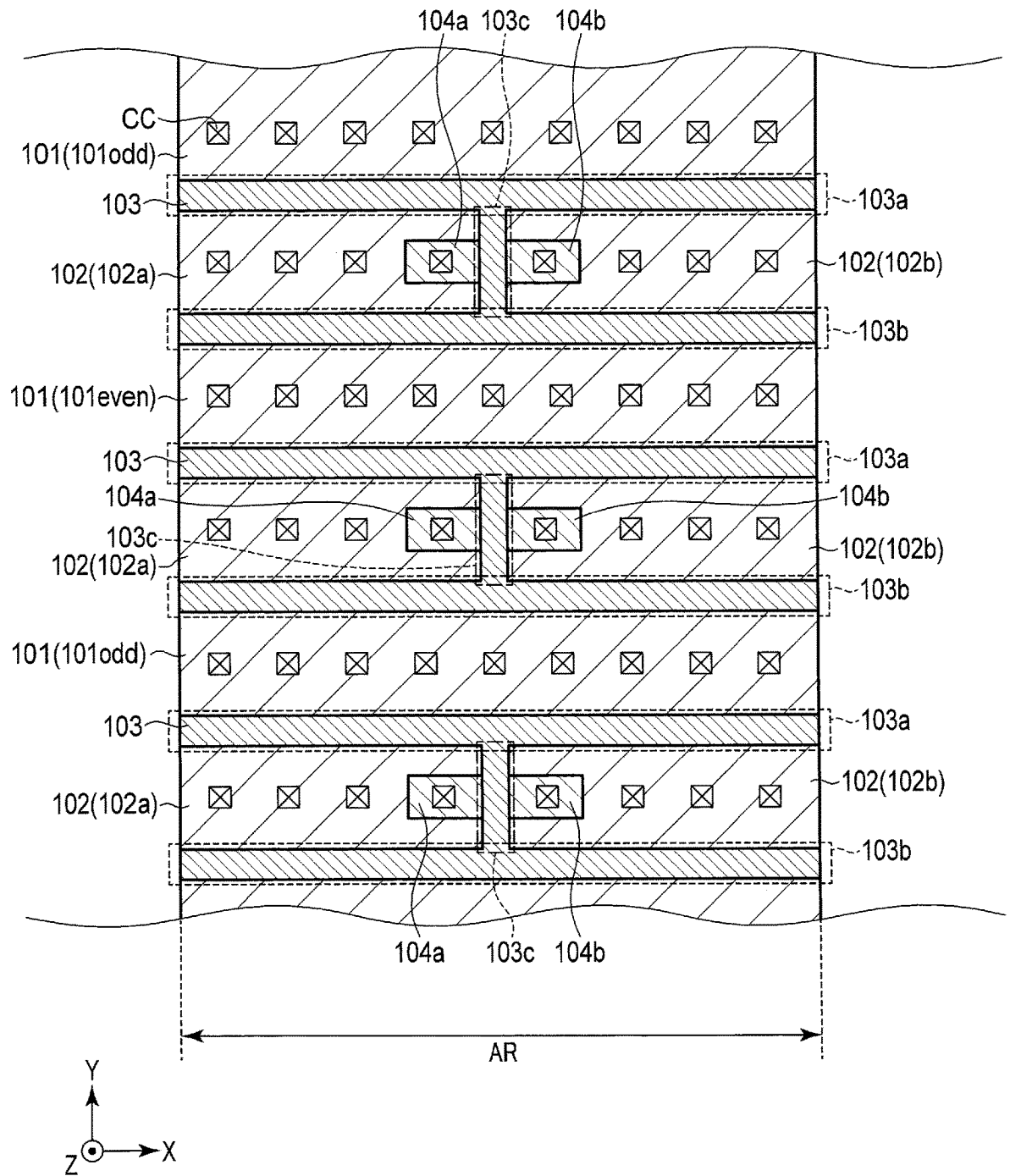
FIG. 3 is a plan view showing an example of a planar layout of the semiconductor device according to the first embodiment.

In general, according to one embodiment, a semiconductor device is formed on a silicon on insulator (SOI) substrate. The semiconductor device includes a substrate, an insulating layer, and a semiconductor layer. The insulating layer is provided on the substrate. The semiconductor layer is provided on the insulating layer. The semiconductor device includes a first power line, a second power line, a plurality of first diodes, a first resistor, a first P-type transistor, a first N-type transistor, a second P-type transistor, a second N-type transistor, and a third N-type transistor. The plurality of first diodes is coupled in series between the first power line and a first node, with anodes on a first power line side. The first resistor is coupled between the first node and the second power line. The first P-type transistor with a gate is coupled to the first node, a source is coupled to the first power line, a body is coupled to the first power line, and a drain is coupled to a second node. The first N-type transistor with a gate is coupled to the first node, a source is coupled to the second power line, a body is coupled to the second power line, and a drain is coupled to the second node. The second P-type transistor with a gate is coupled to the second node, a source is coupled to the first power line, a body is coupled to the first power line, and a drain is coupled to a third node. The second N-type transistor with a gate is coupled to the second node, a source is coupled to the second power line, a body is coupled to the second power line, and a drain is coupled to the third node. The third N-type transistor with a gate is coupled to the third node, a source is coupled to the second power line, a body is coupled to the second power line, and a drain is coupled to the first power line. A value obtained by dividing a gate width of the first P-type transistor by a gate length thereof is smaller than a value obtained by dividing a gate width of the first N-type transistor by a gate length thereof. A value obtained by dividing a gate width of the second N-type transistor by a gate length thereof is smaller than a value obtained by dividing a gate width of the second P-type transistor by a gate length thereof. The value obtained by dividing the gate width of the second N-type transistor by the gate length thereof is smaller than the value obtained by dividing the gate width of the first N-type transistor by the gate length thereof. The value obtained by dividing the gate width of the first N-type transistor by the gate length thereof is smaller than a value obtained by dividing a gate width of the third N-type transistor by a gate length thereof.

Hereinafter, embodiments will be described with reference to the accompanying drawings. Each embodiment is an example of a device or method that embodies a technical idea of the invention. The drawings are schematic or conceptual, and the dimensions, ratios, and the like in the drawings are not always the same as the actual ones. The technical ideas of the present invention are not specified by the shapes, structures, arrangements, etc. of the constituent elements.

In the following description, constituent elements having substantially the same function and configuration will be assigned the same reference numeral or symbol. A numeral following letters constituting a reference symbol is used to distinguish between elements having similar configurations and denoted by reference symbols including the same letters. If elements denoted by reference symbols including the same letters need not be distinguished, those elements are assigned reference symbols including the same letters only.

[1] First Embodiment

A semiconductor system 1 according to a first embodiment is a type of semiconductor system, which includes a protective device that protects against ESD. The semiconductor system 1 is an integrated circuit (IC) manufactured by, for example, a silicon on insulator (SOI) complementary metal oxide semiconductor (CMOS) process. The semiconductor system 1 has, for example, a function of amplifying radio-frequency signals relating to wireless communication. The semiconductor system 1 according to the first embodiment will be described below.

[1-1] Configuration

[1-1-1] Overall Configuration of Semiconductor System 1

FIG. 1 is a block diagram showing an example of the configuration of the semiconductor system 1 according to the first embodiment. As shown in FIG. 1, the semiconductor system 1 includes a power line PL1, a power line PL2, a terminal T1, a terminal T2, a semiconductor device 10, and a semiconductor device 20.

The power lines PL1 and PL2 are each used for supply of a power supply voltage to each device included in the semiconductor system 1. The terminals T1 and T2 are each configured to be coupled to an external device of the semiconductor system 1. The terminal T1 is a positive-side power supply terminal of the semiconductor system 1, and is coupled to the power line PL1. The terminal T1 is applied with, for example, a power supply voltage. The terminal T2 is a negative-side power supply terminal of the semiconductor system 1, and is coupled to the power line PL2. The terminal T2 is, for example, grounded.

The semiconductor devices 10 and 20 are, for example, integrated (mounted) on a single semiconductor chip. The semiconductor device 10 is a protective device used as a measure against ESD. The semiconductor device 10 is coupled to the power lines PL1 and PL2. The semiconductor device 10 functions as a discharge path between the power line PL1 and the power line PL2 when an ESD is applied to the semiconductor system 1 to protect the semiconductor device 20. The semiconductor device 20 is coupled to the power lines PL1 and PL2. The semiconductor device 20 executes various operations of the semiconductor system 1. The semiconductor device 20, for example, amplifies radio-frequency signals relating to wireless communication.

[1-1-2] Configuration of Semiconductor Device 10
(Circuit Configuration of Semiconductor Device 10)

FIG. 2 is a circuit diagram showing an example of the circuit configuration of the semiconductor device 10 according to the first embodiment. As shown in FIG. 2, the semiconductor device 10 includes diodes DI11 and DI12, a resistor R1, transistors PM1 and PM2, and transistors NM1, NM2, and NM3.

The diodes DI11 and DI12 are p-n junction diodes. The forward voltages of the diodes DI11 and DI12 are each, for example, 0.7 V. The transistors PM1 and PM2 are P-type MOSFETs, and the transistors NM1, NM2, and NM3 are N-type MOSFETs.

The diodes DI11 and DI12 are coupled in series between the power line PL1 and a node N1 in such a manner that their anodes are on the power line PL1 side. Specifically, the anode of the diode DI11 is coupled to the power line PL1. The cathode of the diode DI11 is coupled to the anode of the diode DI12. The cathode of the diode DI12 is coupled to the node N1.

One end of the resistor R1 is coupled to the node N1. The other end of the resistor R1 is coupled to the power line PL2.

A pair of the transistors PM1 and NM1 constitutes an inverter INV1. Specifically, the gate of the transistor PM1 is coupled to the node N1. The source of the transistor PM1 is coupled to the power line PL1. The drain of the transistor PM1 is coupled to a node N2. The body of the transistor PM1 is coupled to the power line PL1. The gate of the transistor NM1 is coupled to the node N1. The source of the transistor NM1 is coupled to the power line PL2. The drain of the transistor NM1 is coupled to the node N2. The body of the transistor NM1 is coupled to the power line PL2. The inverter INV1 inverts the logic level of the node N1, and outputs the inverted level to the node N2.

A pair of the transistors PM2 and NM2 constitutes an inverter INV2. Specifically, the gate of the transistor PM2 is coupled to the node N2. The source of the transistor PM2 is coupled to the power line PL1. The drain of the transistor PM2 is coupled to a node N3. The body of the transistor PM2 is coupled to the power line PL1. The gate of the transistor NM2 is coupled to the node N2. The source of the transistor NM2 is coupled to the power line PL2. The drain of the transistor NM2 is coupled to the node N3. The body of the transistor NM2 is coupled to the power line PL2. The inverter INV2 inverts the logic level of the node N2, and outputs the inverted level to the node N3.

The gate of the transistor NM3 is coupled to the node N3. The source of the transistor NM3 is coupled to the power line PL2. The drain of the transistor NM3 is coupled to the power line PL1. The body of the transistor NM3 is coupled to the power line PL2.

The transistor PM1 is smaller in size than the transistor NM1. The transistor NM1 is smaller in size than the transistor NM3. The transistor NM2 is smaller in size than the transistor PM2. The transistor NM2 is smaller in size than the transistor NM1.

Herein, the sizes of transistors are compared based on the magnitude relationship of the aspect ratio "W/L" defined by the gate length "L" and gate width "W" of the gate electrode of the transistor. In other words, the sizes of transistors are compared based on the magnitude relationship of the value "W/L" obtained by dividing the gate width "W" of the transistor by the gate length "L" of the transistor. When a plurality of transistors with the same gate length "L" are coupled in parallel to one another, it is possible to sum the gate widths of the transistors coupled in parallel and assume that a transistor with the total gate length is provided.

The semiconductor device 10 may also be described as including a detector, a driver, and a shunt MOS. The detector includes the diodes DI11 and DI12 and the resistor R1. The detector detects a rise in the voltage of the power line PL1. The driver includes the inverters INV1 and INV2. The driver drives the gate of the shunt MOS based on a detection result of the detector. The shunt MOS is the transistor NM3. The gate of the shunt MOS is driven by the detector and, when an ESD is detected, the shunt MOS functions as a discharge path.

(Structure of Transistor NM3)

Hereinafter, a structure of the transistor NM3 will be described. In the drawings to be referred to below, the plane defined by the X-direction and the Y-direction corresponds to a plane parallel to the surface of a support substrate, and the Z direction corresponds to a vertical direction that is perpendicular to the surface of the support substrate. The support substrate is a semiconductor substrate on which at least the transistor NM3 is formed. For example, the semiconductor devices 10 and 20 are formed on the support substrate as a single semiconductor chip.

FIG. 3 is a plan view showing an example of a planar layout of the semiconductor device 10 according to the first embodiment. FIG. 3 focuses on the layout of a semiconductor layer including a portion that functions as the transistor NM3 of the structure of the semiconductor device 10. As shown in FIG. 3, the semiconductor device 10 includes an active region AR and a plurality of contacts CC.

The active region AR is a semiconductor layer on an insulating layer provided on the support substrate, and extends in the Y-direction. Specifically, the active region AR includes N-type diffusion regions 101, N-type diffusion regions 102, P-type diffusion regions 103, and P-type diffusion regions 104.

The N-type diffusion regions 101 and 102 are regions of the semiconductor layer, in which N-type impurities are diffused. The P-type diffusion regions 103 and 104 are regions of the semiconductor layer, in which P-type impurities are diffused. The concentration of P-type impurities in the P-type diffusion regions 103 is lower than that in the P-type diffusion regions 104.

The N-type diffusion regions 101 function as the drain of the transistor NM3. The N-type diffusion regions 102 function as the source of the transistor NM3. The P-type diffusion regions 103 function as the body of the transistor NM3. The P-type diffusion regions 104 are electrically coupled to the P-type diffusion regions 103.

The N-type diffusion regions 101 each extend in the X-direction from one X-directional end to the other X-directional end of the active region AR. The N-type diffusion regions 101 are aligned in the Y-direction in the active region AR. Hereinafter, of the N-type diffusion regions 101 aligned in the Y-direction, the odd-numbered N-type diffusion regions 101 will also be referred to as "101odd", and the even-numbered N-type diffusion regions 101 will also be referred to as "101even".

The N-type diffusion regions 102 each extend in the X-direction from one X-directional end to the other X-directional end of the active region AR, and are each provided between adjacent N-type diffusion regions 101.

The P-type diffusion regions 103 are each provided between N-type diffusion regions 101 adjacent to each other in the Y-direction. Specifically, the P-type diffusion regions 103 each include a first portion 103a, a second portion 103b, and a third portion 103c. The first portion 103a extends in the X-direction from one X-directional end to the other X-directional end of the active region AR, and is provided between the N-type diffusion region 101 odd and the N-type diffusion region 102. The second portion 103b extends in the X-direction from one X-directional end to the other X-directional end of the active region AR, and is provided between the N-type diffusion region 101 even and the N-type diffusion region 102. The third portion 103c extends in the Y direction to divide the N-type diffusion region 102, and couples the first portion 103a to the second portion 103b. The N-type diffusion region 102 is divided into N-type diffusion regions 102a and 102b by the third portion 103c of the P-type diffusion region 103.

The P-type diffusion regions 104 each include a pair of P-type diffusion regions 104a and 104b. The pair of P-type diffusion regions 104a and 104b interpose the third portion 103c of the P-type diffusion region 103 therebetween in the X-direction. The P-type diffusion region 104a is surrounded by the third portion 103c of the P-type diffusion region 103 and the N-type diffusion region 102a. The P-type diffusion region 104b is surrounded by the third portion 103c of the P-type diffusion region 103 and the N-type diffusion region 102b.

The above-described combination of an N-type diffusion region 101, an N-type diffusion region 102, a P-type diffusion region 103, and a P-type diffusion region 104 is repeatedly provided in the Y-direction.

The contacts CC each electrically couple the diffusion region in which the contact CC is provided to a conductor provided in an interconnect layer to be described later. Contacts CC are provided in each of the N-type diffusion regions 101, N-type diffusion regions 102, and P-type diffusion regions 104.

Specifically, contacts CC are aligned in the X direction in each N-type diffusion region 101. Contacts CC are aligned in the X direction in each of the N-type diffusion regions 102a and 102b. Contacts CC are provided respectively in the P-type diffusion regions 104a and 104b so that these contacts CC are aligned in the X-direction together with the contacts CC in the N-type diffusion regions 102a and 102b.

Figure 4:
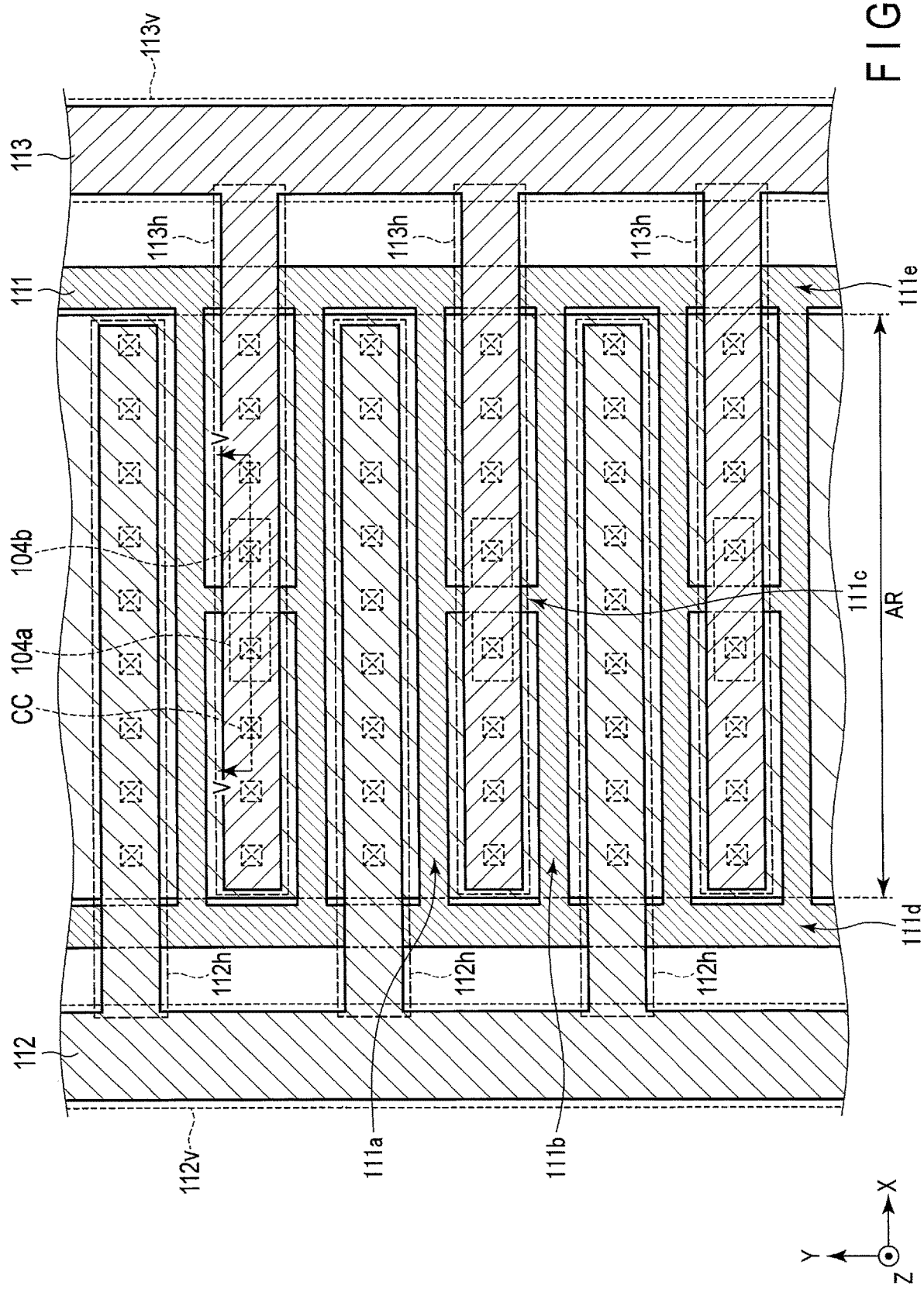
FIG. 4 is a plan view showing an example of a planar layout of the semiconductor device according to the first embodiment.

FIG. 4 is a plan view showing an example of a planar layout of the semiconductor device 10 according to the first embodiment. FIG. 4 focuses on the layout of an interconnect layer including a portion that functions as the transistor NM3 of the structure of the semiconductor device 10. As shown in FIG. 4, the semiconductor device 10 further includes a conductor 111, a conductor 112, and a conductor 113.

The conductor 111 includes a portion overlapping the active region AR and a portion not overlapping the active region AR. The portion of the conductor 111 overlapping the active region AR functions as the gate electrode of the transistor NM3. The portion of the conductor 111 not overlapping the active region AR functions as an interconnect of the gate electrode. The portion of the conductor 111 overlapping the active region AR includes multiple combinations of a first portion 111a, a second portion 111b, and a third portion 111c. The portion of the conductor 111 not overlapping the active region AR includes a fourth portion 111*d* and a fifth portion 111*e*.

In the active region AR, the conductor 111 overlaps the P-type diffusion regions 103 in the Z-direction. Specifically, the first portions 111*a* of the conductor 111 respectively overlap the first portions 103*a* of the P-type diffusion regions 103 in the Z-direction. The second portions 111*b* of the conductor 111 respectively overlap the second portions 103*b* of the P-type diffusion regions 103 in the Z-direction. The third portions 111*c* of the conductor 111 respectively overlap the third portions 103*c* of the P-type diffusion regions 103 in the Z-direction.

The first portions 111*a* and second portions 111*b* of the conductor 111 each extend to a region outside the active region AR in the X-direction.

The fourth portion 111*d* and fifth portion 111*e* of the conductor 111 each extend in the Y-direction and are provided to interpose therebetween the active region AR in the X-direction without overlapping the active region AR. The fourth portion 111*d* of the conductor 111 is coupled to the first portions 111*a* and second portions 111*b* in the portion not overlapping the active region AR. The fifth portion 111*e* of the conductor 111 is coupled to the first portions 111*a* and second portions 111*b* in the portion not overlapping the active region AR.

The conductors 112 and 113 are each provided in an upper layer with respect to the conductor 111. The conductors 112 and 113 each contain, for example, a metal. The conductor 112 functions as an interconnect of the drain of the transistor NM3. The conductor 113 functions as an interconnect of the source of the transistor NM3. The layer in which the conductors 112 and 113 are provided is called, for example, an interconnect layer.

The conductor 112 includes a plurality of first portions 112*h* and a second portion 112*v*. The first portions 112*h* each extend in the X-direction, and are each in contact with the contacts CC provided on the corresponding N-type diffusion region 101. The second portion 112*v* extends in the Y-direction in a region outside the active region AR in the X-direction. The second portion 112*v* is coupled to the first portions 112*h*.

The conductor 113 includes a plurality of first portions 113*h* and a second portion 113*v*. The first portions 113*h* each extend in the X-direction, and are each in contact with the contacts CC provided on the corresponding N-type diffusion regions 102*a* and 102*b* and P-type diffusion regions 104*a* and 104*b*. The second portion 113*v* extends in the Y-direction in a region outside the active region AR in the X-direction. The second portion 113*v* is coupled to the first portions 113*h*.

Figure 5:
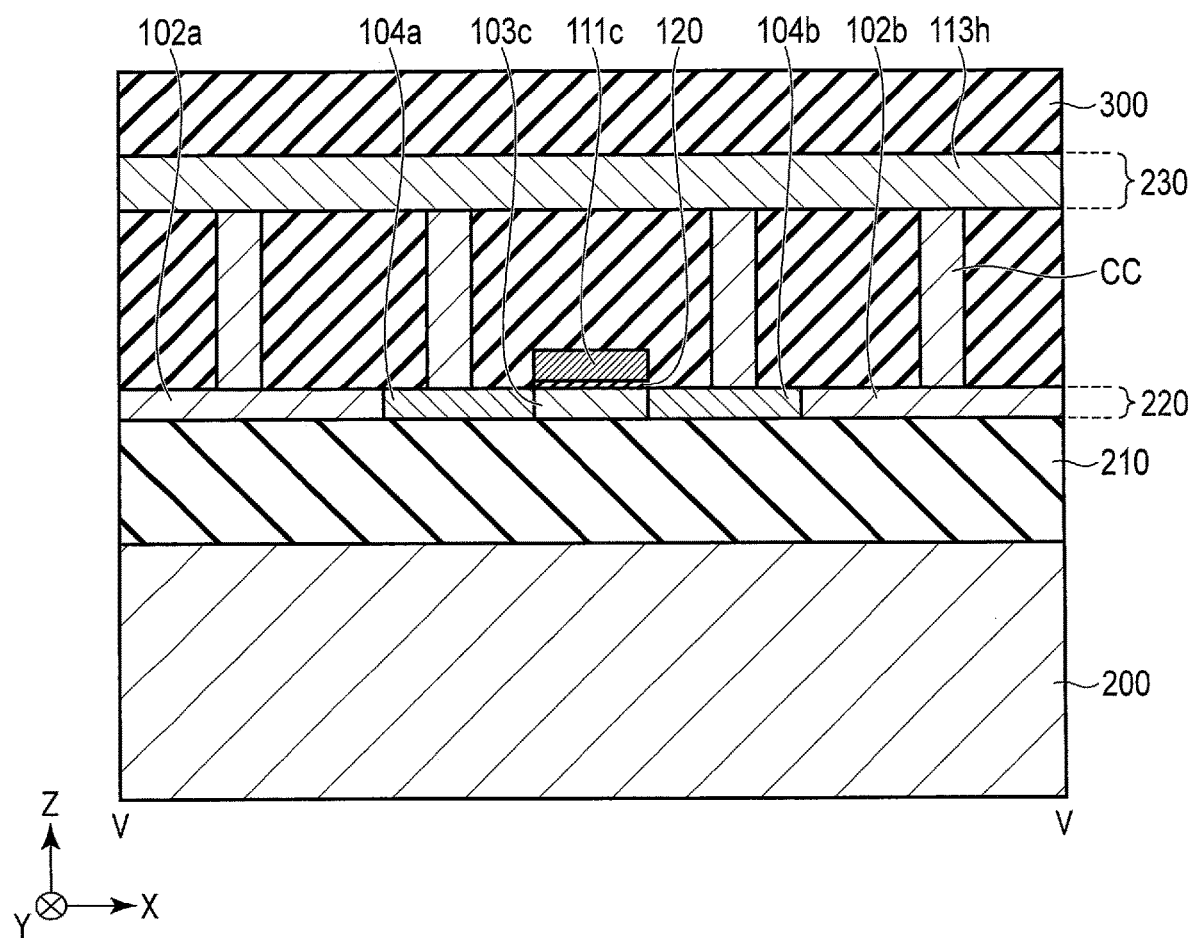
FIG. 5 is a cross-sectional view showing a cross-sectional structure of the semiconductor device, taken along line V-V in FIG. 4.

FIG. 5 is a cross-sectional view showing a cross-sectional structure, taken along line V-V in FIG. 4. As shown in FIG. 5, the semiconductor device 10 includes a support substrate 200, an insulating layer 210, a semiconductor layer 220, an interconnect layer 230, an insulating film 120, a third portion 111*c* of a conductor 111, an insulator 300, and contacts CC. In the region shown in FIG. 5, the semiconductor layer 220 includes N-type diffusion regions 102*a* and 102*b*, a third portion 103*c* of a P-type diffusion region 103, and P-type diffusion regions 104*a* and 104*b*. In the region shown in FIG. 5, the interconnect layer 230 includes a first portion 113*h* of the conductor 113.

The support substrate 200 contains, for example, silicon.

The insulating layer 210 is provided on the support substrate 200. The insulating layer 210 contains, for example, silicon oxide.

The semiconductor layer 220 is provided on the insulating layer 210. In the semiconductor layer 220 in the region shown in FIG. 5, the N-type diffusion region 102*a*, the P-type diffusion region 104*a*, the third portion 103*c* of the P-type diffusion region 103, the P-type diffusion region 104*b*, and the N-type diffusion region 102*b* are provided in order in the X-direction.

The insulating film 120 is provided on the third portion 103*c* of the P-type well region 103. The insulating film 120 contains, for example, silicon oxide. The third portion 111*c* of the conductor 111 is provided on the insulating film 120 provided on the third portion 103*c* of the P-type well region 103.

In the active region AR, the insulating film 120 is provided between the P-type diffusion region 103 and the third portion 111*c* of the conductor 111. The insulating film 120 functions as a gate insulating film of the transistor NM3.

Contacts CC are provided on the semiconductor layer 220. Specifically, contacts CC are provided respectively on the N-type diffusion regions 102*a* and 102*b* and the P-type diffusion regions 104*a* and 104*b*.

The interconnect layer 230 is provided above the semiconductor layer 220. In the region shown in FIG. 5, the first portion 113*h* of the conductor 113 is provided in the interconnect layer 230. The first portion 113*h* of the conductor 113 is in contact with the contacts CC provided respectively on the N-type diffusion regions 102*a* and 102*b* and the P-type diffusion regions 104*a* and 104*b*.

The regions above the semiconductor layer 220, in which the above-described structures are not provided, are filled with the insulator 300. The insulator 300 is, for example, silicon oxide.

A structure of the transistor NM3 has been described with reference to FIGS. 3 to 5; however, the transistors other than the transistor NM3 may have a similar structure.

The structure of the transistor NM3 described with reference to FIGS. 3 to 5 could also be described, for example, as follows.

The transistor NM3 is comprised of a plurality of unit FETs, the X-directional length of each of which corresponds to the gate length, and which are coupled in parallel to one another in the Y-direction. The configuration in which a plurality of unit FETs are coupled in parallel to one another is called, for example, a multi-finger FET.

The conductor 111, which functions as the gate electrode, is formed in a ladder shape. Of the conductor 111, the first portion 111*a* and second portion 111*b*, which extend in the X-direction and overlap the first portion 103*a* and second portion 103*b* of the P-type diffusion region 103, constitute the gate of an intrinsic FET.

The conductor 111 formed in a ladder shape includes the fourth portion 111*d* and the fifth portion 111*e*, which extend in the Y-direction. The fourth portion 111*d* and fifth portion 111*e* of the conductor 111 are used to couple a plurality of first portions 111*a* and second portions 111*b*, i.e., the gates of the multi-finger FET. Although not shown, the conductor 111 is coupled to an interconnect provided in an upper layer by a contact.

Each pair of gate electrodes, which extend in the X-direction, are coupled to each other at their center portions by a portion extending in the Y-direction. Specifically, the first portion 111*a* and second portion 111*b* of the conductor 111 are coupled by the third portion 111*c*. This configuration is for formation of a body junction.

The third portion 111*c* of the conductor 111 overlaps the third portion 103*c* of the P-type diffusion region 103. The third portion 103*c* of the P-type diffusion region 103 is interposed between a pair of P-type diffusion regions 104 in the X-direction. This configuration enables provision of the P-type diffusion regions 104 electrically coupled to the p-type diffusion regions 103, which function as the body of the transistor. The contacts CC provided on the P-type diffusion regions 104 are aligned with the contacts CC provided on the N-type diffusion regions 102, which function as the source, in the X direction. The contacts CC provided on the P-type diffusion regions 104 and the contacts CC provided on the N-type diffusion regions 102 are coupled to the first portions 113*h* of the conductor 113. The body and source interconnects of the transistor are coupled to each other in this manner.

(Structure of Diode)

Figure 6:
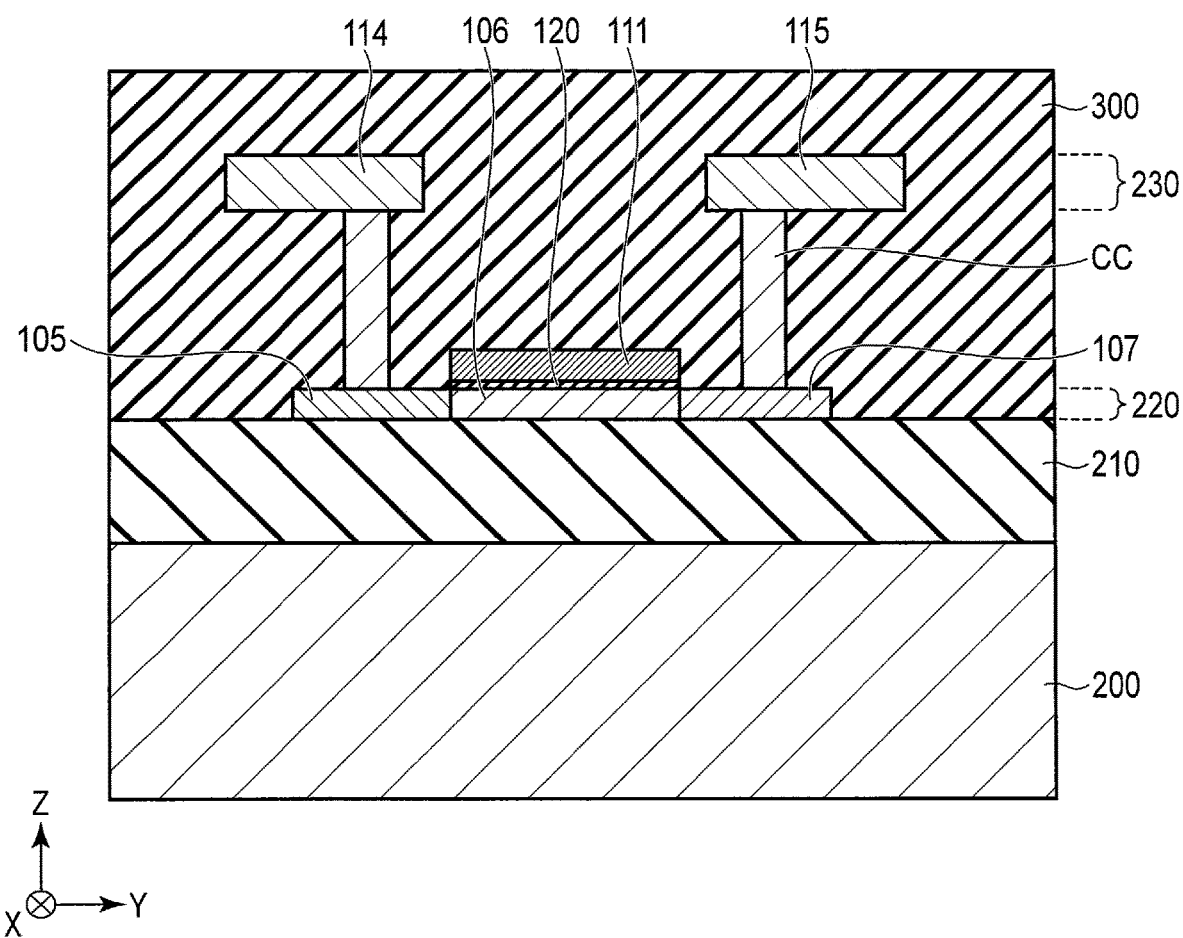
FIG. 6 is a cross-sectional view showing an example of a cross-sectional structure of a diode included in the semiconductor device according to the first embodiment.

FIG. 6 is a cross-sectional view showing an example of a cross-sectional structure of the diode DI11 included in the semiconductor device 10 according to the first embodiment. As shown in FIG. 6, the semiconductor device 10 includes a support substrate 200, an insulating layer 210, a semiconductor layer 220, an interconnect layer 230, an insulating film 120, a conductor 111, an insulator 300, and contacts CC. In the region shown in FIG. 6, the semiconductor layer 220 includes a P-type diffusion region 105, an N-type diffusion region 106, and an N-type diffusion region 107. In the region shown in FIG. 6, the interconnect layer 230 includes a conductor 114 and a conductor 115.

The arrangement of the support substrate 200 and insulating layer 210 are similar to that in the cross-section structure described with reference to FIG. 5.

In the semiconductor layer 220 in the region shown in FIG. 6, the P-type diffusion region 105, the N-type diffusion region 106, and the N-type diffusion region 107 are provided in order in the Y-direction. The P-type diffusion region 105 is a region in the semiconductor layer 220 in which P-type impurities are diffused. The N-type diffusion regions 106 and 107 are regions in the semiconductor layer 220 in which N-type impurities are diffused. The concentration of N-type impurities in the N-type diffusion region 106 is lower than that in the N-type diffusion region 107.

The insulating film 120 is provided on the N-type diffusion region 106. The conductor 111 is provided on the insulating film 120 provided on the N-type diffusion region 106. The conductor 111 is in an electrically-floating state.

The contacts CC are provided respectively on the P-type diffusion region 105 and the N-type diffusion region 107.

The interconnect layer 230 is provided above the semiconductor layer 220. In the interconnect layer 230 in the region shown in FIG. 6, the conductors 114 and 115 are provided. The conductor 114 is in contact with the contact CC provided on the P-type diffusion region 105. The conductor 115 is in contact with the contact CC provided on the N-type diffusion region 107.

The regions in the semiconductor layer 220, in which no semiconductor is provided, and the regions above the semiconductor layer 220, in which the above-described structures are not provided, are filled with the insulator 300. The insulator 300 is, for example, silicon oxide.

The P-type diffusion region 105 corresponds to the anode of the diode DI11. The N-type diffusion regions 106 and 107 correspond to the cathode of the diode DI11. The contact surface between the P-type diffusion region 105 and the N-type diffusion region 106 corresponds to the p-n junction of the diode DI11.

The conductor 114 functions as an interconnect of the anode of the diode DI11. The conductor 115 functions as an interconnect of the cathode of the diode DI11.

The structure of the diode shown in FIG. 6 is called, for example, a lateral type, and is similar to that of the transistor. Specifically, the P-type diffusion region 105, the N-type diffusion region 106, and the N-type diffusion region 107 are similar in structure to the source or drain, body, drain or source of the transistor, respectively. The insulating film 120 and conductor 111 provided on the N-type diffusion region 106 are similar in structure to the gate insulating film and gate electrode of the transistor. Herein, when the transistor 111 is regarded as the gate electrode of the transistor, the Y-directional length of the conductor 111 corresponds to the gate length "L" of the transistor, and the X-directional length of the conductor 111 corresponds to the gate width "W" of the transistor. The area of the p-n junction of the diode DI11 can be calculated from the Z-directional thickness of the semiconductor layer 220 and the X-directional lengths of the P-type diffusion region 105 and N-type diffusion region 106.

The P-type diffusion region 105 and N-type diffusion regions 106 and 107 are formed by ion injection processing using the conductor 111 as a mask. Therefore, the shapes of the P-type diffusion region 105 and N-type diffusion regions 106 and 107 correspond to the shape of the conductor 111. Therefore, it can be said that, in a lateral-type diode, the area of the p-n junction is large when the gate width "W" is large, wherein the area of the p-n junction is small when the gate width "W" is small.

An example of the diode DI11 has been described with reference to FIG. 6; however, the structure of the diode DI12 is similar. An example of the case where the N-type diffusion region 106 is provided below the conductor 111 has been described with reference to FIG. 6; however, the N-type diffusion region 106 may be replaced with a P-type diffusion region. When a P-type diffusion region is provided below the conductor 111, for example, the contact surface between the N-type diffusion region 107 and the P-type diffusion region provided below the conductor 111 functions as the PN function of the diode.

[1-2] Operation

The semiconductor device 10 according to the first embodiment performs different operations depending on the condition. Hereinafter, the case where a power supply voltage is applied to the semiconductor system 1 and the semiconductor system 1 performs a normal operation and the case where a positive ESD is applied to the semiconductor system 1 will be described in order.

In each schematic view showing an example of an operation, the on-state transistors and diodes are circled, whereas the off-state transistors and diodes are crossed-out with "X" marks. The arrows are added to illustrate current flows.

(Operation in Normal State)

Figure 7:
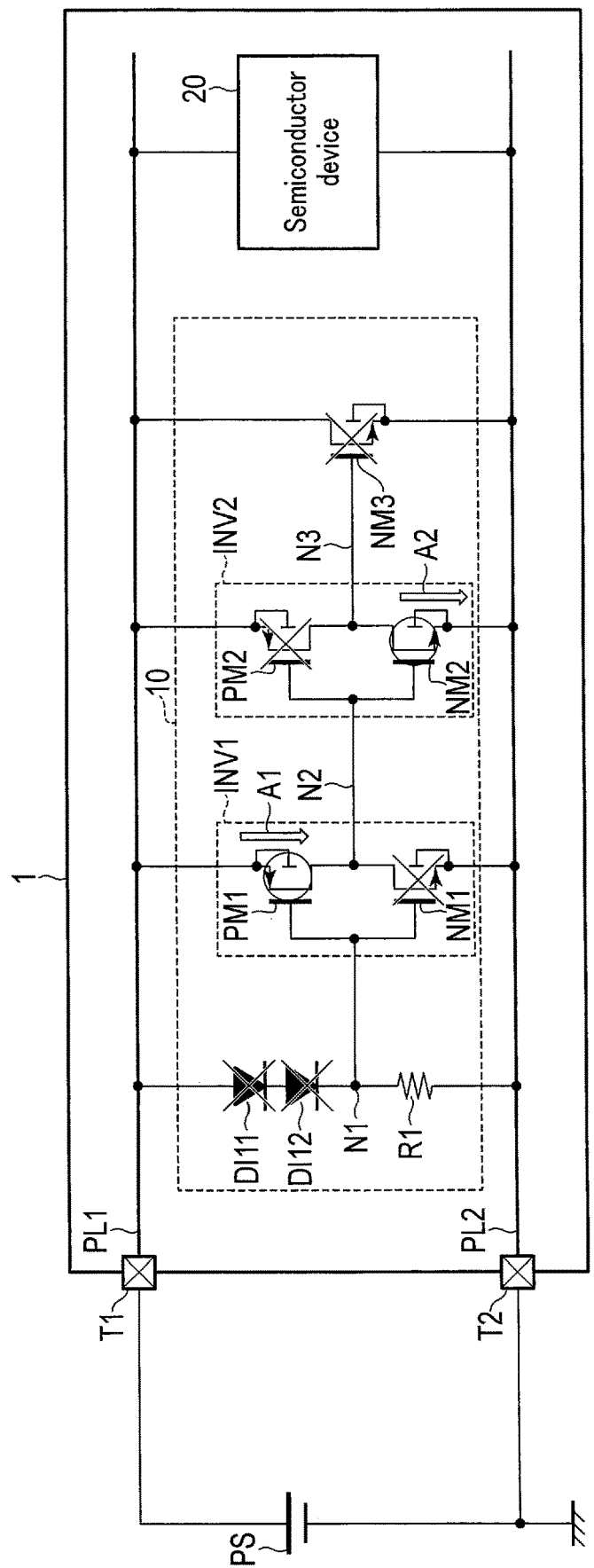
FIG. 7 is a schematic view showing an example of an operation of the semiconductor device according to the first embodiment in a normal state.

FIG. 7 is a schematic view showing an example of an operation performed when the semiconductor system 1 according to the first embodiment is in a normal state. FIG. 7 shows, as an example, the case where a power supply device PS is coupled to the semiconductor system 1. Hereinafter, an operation of the semiconductor device 10 performed when a power supply voltage is applied to the semiconductor system 1 and the semiconductor system 1 performs a normal operation will be described with reference to FIG. 7.

A positive output of the power supply device PS is coupled to the terminal T1. A negative output of the power supply device PS is coupled to the terminal T2 and grounded. The power supply device PS supplies the semiconductor system 1 with a power supply voltage for the semiconductor system 1 to perform the normal operation. The power supply voltage is, for example, 1.2 V. With this configuration, a voltage of 1.2 V is applied to the power line PL1, and the voltage of the power line PL2 is brought to 0 V.

Since the forward voltages of the diodes DI11 and DI12 are each 0.7 V, the sum of the forward voltages is 1.4 V. Since the voltage of the power line PL1 is 1.2 V and is lower than the sum of the forward voltages, the diodes DI11 and DI12 are in the off-state. Since the diodes DI11 and DI12 are in the off-state, the voltage of the node N1 is substantially equal to the voltage of the power line PL2 coupled via the resistor R1.

Since the voltage of the node N1 is substantially equal to the voltage of the power line PL2, the transistor PM1 is brought to the on-state and the transistor NM1 is brought to the off-state. Consequently, as indicated by an arrow A1, a current flows from the power line PL1 to the node N2 via the on-state transistor PM1. As a result, the voltage of the node N2 becomes substantially equal to the voltage of the power line PL1.

Since the voltage of the node N2 is substantially equal to the voltage of the power line PL1, the transistor PM2 is brought to the off-state and the transistor NM2 is brought to the on-state. Consequently, as indicated by an arrow A2, a current flows from the node N3 to the power line PL2 via the on-state transistor NM2. As a result, the voltage of the node N3 becomes substantially equal to the voltage of the power line PL2.

When the voltage of the node N3 is substantially equal to the voltage of the power line PL2, the transistor NM3 is brought to the off-state.

As described above, when a power supply voltage is applied to the semiconductor system 1 and the semiconductor system 1 performs the normal operation, the transistor NM3 of the semiconductor device 10 is brought to the off-state. Thus, the power line PL1 is not coupled to the power line PL2. Namely, a current path is not formed between the power line PL1 and the power line PL2. Accordingly, when the semiconductor system 1 performs the normal operation, the semiconductor device 10 does not function as a discharge path. The other semiconductor devices, such as the semiconductor device 20, coupled to the power lines PL1 and PL2 perform various operations using the power supply voltage. The operations performed by the semiconductor system 20 include, for example, amplification of radio-frequency signals.

(Operation Performed when Positive ESD is Applied)

FIG. 8 is a schematic view showing an example of the case where a positive ESD is applied to the semiconductor device according to the first embodiment. FIG. 8 shows an example of the case where an ESD test device TD1 is coupled to the semiconductor system 1. Hereinafter, an operation of the semiconductor device 10 performed when a positive voltage occurs in the power line PL1 of the semiconductor system 1 due to an ESD will be described with reference to FIG. 8.

A positive output of the ESD test device TD1 is coupled to the terminal T1. A negative output of the ESD test device TD1 is coupled to the terminal T2 and grounded. With this configuration, the ESD test device TD1 can cause a positive ESD to the terminal T1, inject a current due to the ESD to the power line PL1, and raise the voltage of the power line PL1.

The operation of the semiconductor device 10 performed when a positive ESD occurs will be described in order.

When the ESD test device TD1 applies a positive ESD to the terminal T1, a current due to the ESD flows into the power line PL1 as indicated by an arrow A11, and the voltage of the power line PL1 rises.

When the voltage of the power line PL1 rises and exceeds the sum of the forward voltages of the diodes DI11 and DI12, the diodes DI11 and DI12 are brought to the on-state. When the diodes DI11 and DI12 are brought to the on-state, a current flows from the power line PL1 to the power line PL2 via the diodes DI11 and DI12 and the resistor R1, as indicated by an arrow A12. When a current flows into the resistor R1, a voltage difference is caused between both ends of the resistor R1, and the voltage of the node N1 rises.

When the voltage of the node N1 rises and exceeds the threshold voltage of the inverter INV1, the transistor PM1 is brought to the off-state and the transistor NM1 is brought to the on-state. When the transistor NM1 is brought to the on-state, a current flows from the node N2 to the power line PL2 via the on-state transistor NM1 as indicated by an arrow A13, and the voltage of the node N2 drops. Since the transistor NM1 is large in size, the voltage of the node N2 quickly drops.

As the voltage of the node N2 drops, the voltage falls below the threshold voltage of the inverter INV2 in due course. When the voltage of the node N2 falls below the threshold voltage of the inverter INV2, the transistor PM2 is brought to the on-state, and the transistor NM2 is brought to the off-state. When the transistor PM2 is brought to the on-state, a current flows from the power line PL1 to the node N3 via the on-state transistor PM2 as indicated by an arrow A14, and the voltage of the node N3 rises. Since the transistor PM2 is large in size, the voltage of the node N3 quickly rises.

As the voltage of the node N3 rises, the voltage exceeds the threshold voltage of the inverter NM3 in due course. When the voltage of the node N3 exceeds the threshold voltage of the inverter NM3, the transistor NM3 is brought to the on-state. When the transistor NM3 is brought to the on-state, a current flows from the power line PL1 to the power line PL2 via the on-state transistor NM3 as indicated by an arrow A15, and charges that have flown in due to the ESD are discharged.

As described above, when a positive ESD occurs in the semiconductor system 1, the transistor NM3 of the semiconductor device 10 is brought to the on-state, and functions as a discharge path of the ESD. Accordingly, a rise in the voltage of the power line PL1 can be suppressed when a positive ESD occurs in the semiconductor system 1. The suppression of a rise in the voltage of the power line PL1 protects the other semiconductor devices, such as the semiconductor device 20, coupled to the power line PL1 against a voltage rise due to the ESD.

[1-3] Advantageous Effects

The above-described semiconductor system 1 according to the first embodiment can improve the ESD susceptibility. Detailed advantageous effects of the semiconductor system 1 according to the first embodiment will be described below.

For example, to amplify radio-frequency signals, a semiconductor system manufactured by a SOI CMOS process is used. The semiconductor system includes an ESD protective device to prevent damage when an ESD is applied. The ESD protective device preferably has a narrow occupying area and a small inrush current when a power supply voltage is applied, in addition to ESD susceptibility.

As a configuration of the ESD protective device, a configuration including a detector which detects an application of an ESD, a shunt MOS which functions as a discharge path of an ESD, and a driver which drives the gate of the shunt MOS based on a detection result of the detector is known.

The shunt MOS which functions as a discharge path is large in size so as to resist the current of ESD. Therefore, the gate capacitance of the shunt MOS is large. To achieve fast transition of the voltage of the gate of the shunt MOS, for example a plurality of inverters coupled in series are used as the driver.

Generally, in an inverter, a PMOS transistor is larger in size than an NMOS transistor so that the characteristics of the rise of the output signal are substantially the same as those of the fall of the output signal. In addition, for example when two inverters are coupled in series and a capacity load is driven, the sizes of the transistors constituting each inverter are determined so that the drive capacity of the second-stage inverter becomes larger than that of the first-stage inverter.

In the inverter INV1 of the semiconductor device 10 according to the first embodiment, the transistor NM1 is larger in size than the transistor PM1. In the transistor INV2, the transistor PM2 is larger in size than the transistor NM2. The transistor NM2 is smaller in size than the transistor NM1. Namely, the inverters have configurations different from that of a common inverter.

In the semiconductor device 10 according to the first embodiment, the transistors brought to the on-state when an ESD occurs, and more specifically, the transistors NM1 and PM2, are large in size. The transistors brought to the off-state when an ESD is detected, and more specifically, the transistors PM1 and NM2, are small in size. Thus, when an ESD occurs, the voltage of the node N3 can be quickly raised, and the transistor NM3 can be quickly brought to the on-state. This can suppress the peak of the voltage caused in the power line PL1 by the ESD.

As a method for detecting an ESD, a so-called RC triggered MOS (RCTMOS), which includes a resistor and a capacitor coupled in series and detects an ESD using an RC time constant, is known. The semiconductor system 1 according to the first embodiment detects an ESD using the forward voltages of the diodes. Accordingly, the semiconductor system 1 according to the first embodiment can suppress the magnitude of the inrush current when a power supply voltage is applied, in comparison with the RCTMOS. When the resistance value varies at the time of manufacturing the semiconductor system, an effect on ESD susceptibility can be suppressed.

In the semiconductor system 1 according to the first embodiment, the process of forming the diodes DI11 and DI12 can be integrated into the process of forming transistors. Thus, the cost for forming diodes can be suppressed.

In addition, in the semiconductor system 1 according to the first embodiment, the body and source are coupled to each other in each of the transistors PM1, PM2, and NM1 to NM3. This can make the drain-source withstand voltage of each transistor higher than when the body of the transistor is floating. Since the drain-source withstand voltage can be made high, the area of the transistor can be suppressed.

[2] Second Embodiment

The configuration of a semiconductor system 1 according to a second embodiment differs from that of the semiconductor system 1 according to the first embodiment in that semiconductor system 1 includes a semiconductor device 11 instead of the semiconductor device 10. Hereinafter, the semiconductor device 11 according to the second embodiment will be described regarding the points different from the first embodiment.

[2-1] Configuration of Semiconductor Device 11

FIG. 9 is a circuit diagram showing an example of the circuit configuration of the semiconductor device 11 according to the second embodiment. As shown in FIG. 9, the semiconductor device 11 according to the second embodiment has a configuration in which a diode DI21 is added to the semiconductor device 10 according to the first embodiment.

The diode DI21 is a p-n junction diode. The forward voltage of the diode DI21 is, for example, 0.7 V.

The anode of the diode DI21 is coupled to the power line PL2. The cathode the diode DI21 is coupled to the power line PL1.

The structure of the diode DI21 is similar to those of the diodes DI11 and DI12. The area of the p-n junction of the diode DI21 is larger than either of the area of the p-n junction of the diode DI11 and the area of the p-n junction of the diode DI12.

The other configuration of the semiconductor device 11 according to the second embodiment is similar to that of the semiconductor device 10 of the first embodiment.

[2-2] Operation

The semiconductor device 11 according to the second embodiment performs different operations depending on the condition. Operations of the semiconductor device 11 in the case where a power supply voltage is applied to the semiconductor system 1 and the semiconductor system 1 performs a normal operation and the case where a positive ESD is applied to the semiconductor system 1 are the same as those of the semiconductor device 10 described in the first embodiment. An operation of the semiconductor device 11 performed when a negative ESD is applied to the semiconductor system 1 will be described below.

(Operation Performed when Negative ESD is Applied)

FIG. 10 is a schematic view showing an example of the operation performed when a negative ESD is applied to the semiconductor device according to the second embodiment. FIG. 10 shows, as an example, the case where an ESD test device TD2 is coupled to the semiconductor system 1. Hereinafter, an operation of the semiconductor device 11 performed when a negative voltage occurs in the power line PL1 of the semiconductor system 1 due to an ESD will be described with reference to FIG. 10.

A positive output of the ESD test device TD2 is coupled to the terminal T2 and grounded. A negative output of the ESD test device TD2 is coupled to the terminal T1. With this configuration, the ESD test device TD2 can cause a negative ESD to the terminal T1, draw a current due to the ESD from the power line PL1, and thereby lower the voltage of the power line PL1.

The operation of the semiconductor device 11 performed when a negative ESD occurs will be described in order.

When the ESD test device TD2 applies a negative ESD to the terminal T1, a current due to the ESD is drawn from the power line PL1 as indicated by an arrow A21, and the voltage of the power line PL1 drops.

When the voltage of the power line PL1 drops to such a level that the difference between the voltage of the power line PL1 and the voltage of the power line PL2 exceeds the forward voltage of the diode DI21, the diode DI21 is brought to the on-state. When the diode DI21 is brought to the on-state, a current flows into the diode DI21 as indicated by an arrow A22, and charges that have occurred due to the ESD are discharged.

When the diode DI21 is in the on-state, the diodes DI11 and DI12, transistors PM1 and PM2, and transistors NM1, NM2, and NM3 are in the off-state.

In addition, a parasitic diode exists between the body and drain of the transistor NM3. Specifically, the anode of the parasitic diode is coupled to the body of the transistor NM3. The cathode of the parasitic diode is coupled to the drain of the transistor NM3. Hereinafter, this parasitic diode will be called a diode DI0. When the diode DI21 is in the on-state, the diode DI0 is also in the on-state, and a current may flow as indicated by an arrow A23. Since the parasitic resistance component of the diode DI0 may be large, the current indicated by the arrow A23 is small. Thus, the main discharge path used when a negative ESD occurs is DI21.

As described above, when a negative ESD occurs in the semiconductor system 1, the diode DI21 of the semiconductor device 11 is brought to the on-state, and functions as a discharge path of the ESD. Accordingly, a drop in the voltage of the power line PL1 can be suppressed when a negative ESD occurs in the semiconductor system 1. The suppression of a drop in the voltage of the power line PL1 protects the other semiconductor devices, such as the semiconductor device 20, coupled to the power line PL1 against a voltage drop due to ESD.

[2-3] Advantageous Effects

The above-described semiconductor system 1 according to the second embodiment can improve the ESD susceptibility. Detailed advantageous effects of the semiconductor system 1 according to the second embodiment will be described below.

In the ESD protective device, a parasitic diode exists between the body and drain of the NMOS transistor used as a discharge path. It is known that, when the body and source of an NMOS transistor used as a discharge path are coupled, the parasitic diode is utilized as a discharge path upon occurrence of a negative ESD.

Transistors manufactured by a SOI CMOS process can be roughly classified into a partially depleted type and a fully depleted type, depending on the proportion of the maximum depleted layer width to the semiconductor layer. In a partially depleted transistor, the semiconductor layer is thicker than the maximum depleted layer width, and a neutral region exists in a low portion of the body. In a fully depleted transistor, the semiconductor layer is thinner than the maximum depleted layer width, and the entire channel is depleted.

A fully depleted transistor or a partially depleted transistor that is nearly fully depleted has excellent radio-frequency characteristics. Therefore, a fully depleted transistor or a partially depleted transistor that is nearly fully depleted is used in a semiconductor system that handles radio-frequency signals.

However, in a fully depleted transistor or a partially depleted transistor that is nearly fully depleted, the parasitic resistance component of the parasitic diode may be large because the semiconductor layer is depleted throughout the entire or a large part of the thickness. When a parasitic diode with a large parasitic resistance component is utilized as a discharge path, a decrease in the voltage of the power line PL1 when a negative ESD occurs may be large.

In contrast, in the semiconductor system 1 according to the second embodiment, the semiconductor device 11 includes the diode DI21. The diode DI21 is provided between the power line PL1 and the power line PL2 to function as a discharge path of a negative ESD. The diode DI21 is a lateral-structure diode. The diode DI21 utilizes its lateral structure to have a p-n junction with a sufficient area so that the parasitic resistance component becomes small. Accordingly, a drop in the voltage of the power line PL1 can be suppressed when a negative ESD occurs.

[3] Third Embodiment

A semiconductor system 1a according to a third embodiment differs from the semiconductor system 1 according to the second embodiment in that the semiconductor system 1a further includes a terminal T3 and a signal line SL, includes a semiconductor device 12 instead of the semiconductor device 11, and includes a semiconductor device 21 instead of the semiconductor device 20. Hereinafter, the semiconductor system 1a according to the third embodiment will be described regarding the points different from the second embodiment.

[3-1] Configuration

[3-1-1] Overall Configuration of Semiconductor System 1a

Figure 11:
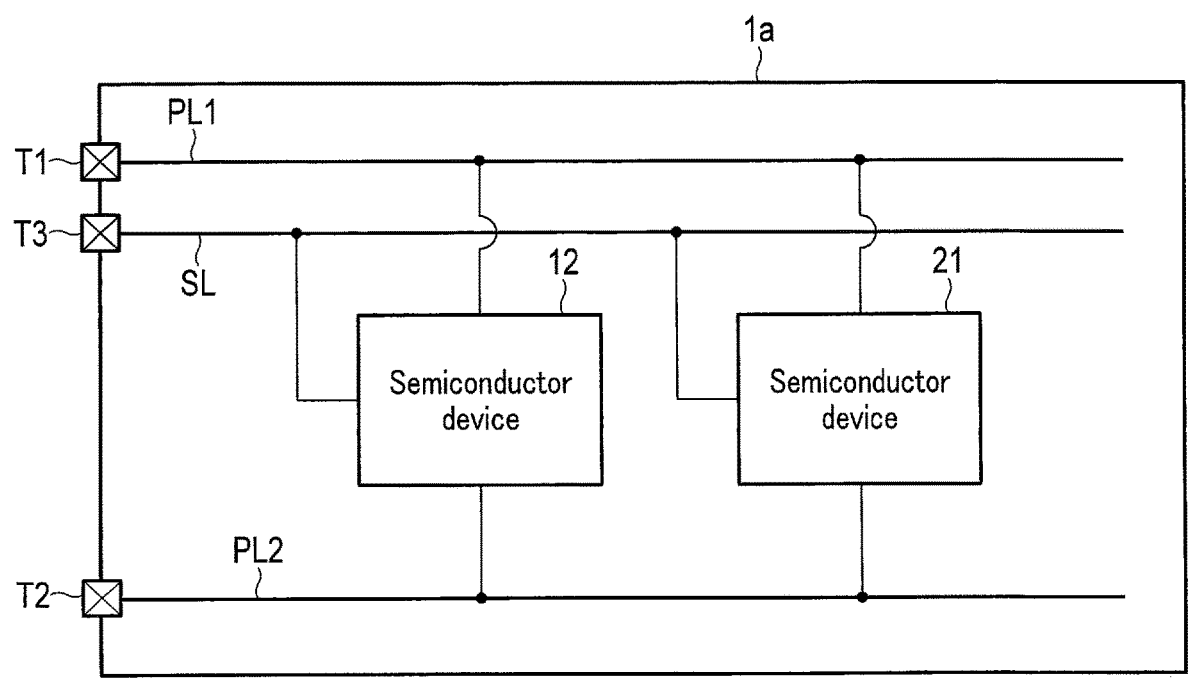
FIG. 11 is a block diagram showing an example of the configuration of a semiconductor system according to a third embodiment.

FIG. 11 is a block diagram showing an example of the configuration of the semiconductor system 1a according to the third embodiment. As shown in FIG. 11, the semiconductor system 1a has a configuration obtained by changing the configuration of the semiconductor system 1 according to the second embodiment to further include the terminal T3 and the signal line SL and to replace the semiconductor device 11 with the semiconductor device 12 and replace the semiconductor device 20 with the semiconductor device 21.

The signal line SL is used to supply signals to devices included in the semiconductor system 1a. The terminal T3 is configured to be coupled to an external device of the semiconductor system 1a. The terminal T3 is a signal terminal of the semiconductor system 1a, and is coupled to the signal line SL.

The semiconductor device 12 is a protective device used as a measure against ESD. The semiconductor device 12 is coupled to the power lines PL1 and PL2 and the signal line SL. The semiconductor device 12 functions as a discharge path between the power line PL1 and the power line PL2 and between the signal line SL and the power line PL1 or the power line PL2 when an ESD is applied to the semiconductor system 1a to protect the semiconductor device 21. The semiconductor device 21 is coupled to the power lines PL1 and PL2 and the signal line SL. The semiconductor device 21 executes various operations of the semiconductor system 1a. The semiconductor system 21, for example, amplifies radio-frequency signals relating to wireless communication. The semiconductor device 21 is controlled by, for example, a signal transmitted through the signal line SL.

[3-1-2] Configuration of Semiconductor Device 12

Figure 12:
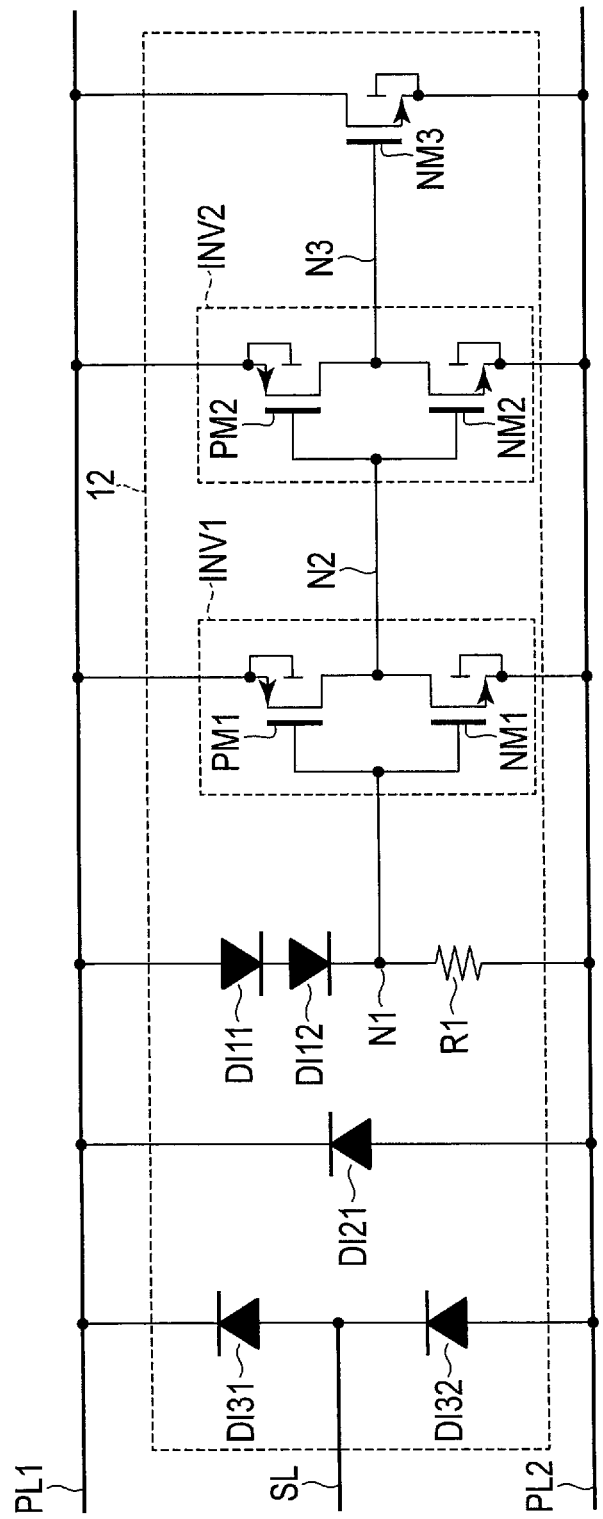
FIG. 12 is a circuit diagram showing an example of the circuit configuration of a semiconductor device according to the third embodiment.

FIG. 12 is a circuit diagram showing an example of the circuit configuration of the semiconductor device 12 according to the third embodiment. As shown in FIG. 12, the semiconductor device 12 according to the third embodiment has a configuration in which diodes DI31 and DI32 are added to the semiconductor device 11 according to the second embodiment.

The diodes DI31 and DI32 are p-n junction diodes. The forward voltages of the diodes DI31 and DI32 are, for example, 0.7 V.

The anode of the diode DI31 is coupled to the signal line SL. The cathode the diode DI31 is coupled to the power line PL1.

The anode of the diode DI32 is coupled to the power line PL2. The cathode of the diode DI32 is coupled to the signal line SL.

The structures of the diodes DI31 and DI32 are similar to those of the diodes DI11, DI12, and DI21. The area of the p-n junction of the diode DI31 is substantially equal to that of the diode DI32. The area of the p-n junction of each of the diodes DI31 and DI32 is larger than either of the area of the p-n junction of the diode DI11 and the area of the p-n junction of the diode DI12.

The other configuration of the semiconductor device 12 according to the third embodiment is similar to that of the semiconductor device 11 of the second embodiment.

[3-2] Operation

The semiconductor system 1a according to the third embodiment differs from the semiconductor system 1 according to the second embodiment in terms of the operation performed when an ESD is applied to the terminal T3. The operation performed when an ESD is applied to the terminals T1 and T2 is similar to that of the semiconductor system 1 according to the second embodiment. Cases where an ESD is applied to the terminal T3 of the semiconductor system 1a according to the third embodiment will be described below.

First, the case where a positive ESD is applied to the terminal T3 and the voltage of the signal line SL rises will be described. When the voltage of the signal line SL exceeds the voltage of the power line PL1 by the forward voltage of the diode DI31 or more, the diode DI31 is brought to the on-state. When the diode DI31 is brought to the on-state, charges that have occurred due to the positive ESD are discharged from the signal line SL to the power line PL1 via the diode DI31. The operation performed when a current due to the ESD flows into the power line PL1 is similar to that in the first embodiment.

The case where a negative ESD is applied to the terminal T3 and the voltage of the signal line SL drops will be described. When the voltage of the signal line SL drops to such a level that the difference between the voltage of the signal line SL and the voltage of the power line PL2 exceeds the forward voltage of the diode DI32, the diode DI32 is brought to the on-state. When the diode DI32 is brought to the on-state, charges that have occurred due to the negative ESD are discharged from the signal line SL to the power line PL2.

As described above, when a negative ESD occurs in the semiconductor system 1a through the terminal T3, the diode DI31 or DI32 of the semiconductor device 12 is brought to the on-state and functions as a discharge path of the ESD. Accordingly, a rise in the voltage of the signal line SL can be suppressed when a positive ESD occurs in the semiconductor system 1a through the terminal T3, and a drop in the voltage of the signal line SL can be suppressed when a negative ESD occurs in the semiconductor system 1a through the terminal T3. The suppression of a rise and drop in the voltage of the signal line SL due to an ESD protects the other semiconductor devices, such as the semiconductor device 21, coupled to the signal line SL against a voltage rise or drop due to the ESD.

[3-3] Advantageous Effects

The above-described semiconductor system 1a according to the third embodiment can improve the ESD susceptibility. Detailed advantageous effects of the semiconductor system 1a according to the third embodiment will be described below.

An ESD may occur in, for example, a terminal included in a semiconductor system and an interconnect coupled to the terminal. For example, when a semiconductor system includes a signal terminal and an interconnect coupled to the signal terminal, it is preferable that the signal terminal and the interconnect coupled to the signal terminal are resistant to ESD.

The semiconductor system 1a according to the third embodiment includes the semiconductor device 12 coupled to the signal line SL. The semiconductor device 12 includes the diode DI31 provided between the signal line SL and the power line PL1, and the diode DI32 provided between the signal line SL and the power line PL2.

With this configuration, the semiconductor system 1a according to the third embodiment can discharge charges to the power line PL1 through the diode DI31 when a positive ESD is applied to the signal line SL. The operation performed when an ESD is applied to the power line PL1 is similar to that described in the first embodiment. The semiconductor system 1a according to the third embodiment can also discharge charges to the power line PL2 through the diode DI32 when a negative ESD is applied to the signal line SL. Namely, the semiconductor system 1a according to the third embodiment can suppress a rise or drop of the voltage due to an ESD also in the terminal T3 and signal lines SL.

[4] Evaluations through Simulations

An evaluation has been performed by simulating the temporal change in the current and voltage to be made when an ESD is applied to the semiconductor device for each of the first embodiment and second embodiment described above and a first example and second example to be described later. The configurations of the comparative examples, specific conditions for simulations, and results of the simulations will be described in order.

[4-1] Configurations of Comparative Examples

First, configurations of the comparative examples will be described below. A first comparative example in which the configurations of inverters are different from the embodiments and a second comparative example known as a so-called RCTMOS will be described in order.

Circuit Configuration of First Comparative Example

FIG. 13 is a circuit diagram showing an example of the circuit configuration of a semiconductor device 13 according to the first comparative example. As shown in FIG. 13, the semiconductor device 13 includes diodes DI111, DI112, and DI121, a resistor R11, transistors PM11 and PM12, and transistors NM11, NM12, and NM13.

The configuration of the semiconductor device 13 according to the first comparative example includes a portion similar to the configuration of the semiconductor device 11 according to the second embodiment and a portion different therefrom. Specifically, the diodes DI111, DI112, DI121, resistor R11, and transistor NM13 included in the semiconductor device 13 correspond to the diodes DI11, DI12, and DI21, transistor R1, and transistor NM3 included in the semiconductor device 11, respectively. The semiconductor device 13 includes inverters INV11 and INV12. The semiconductor device 11 differs from the semiconductor device 13 in terms of including the inverters INV1 and INV2.

The diodes DI111, DI112, and DI121 are p-n junction diodes. The forward voltages of the diodes DI111, DI112, and DI121 are, for example, 0.7 V. The transistors PM11 and PM12 are P-type MOSFETs, and the transistors NM11, NM12, and NM13 are N-type MOSFETs.

The diodes DI111 and DI112 are coupled in series between the power line PL1 and a node N11 in such a manner that their anodes are on the power line PL1 side. Specifically, the anode of the diode DI111 is coupled to the power line PL1. The cathode of the diode DI111 is coupled to the anode of the diode DI112. The cathode of the diode DI112 is coupled to the node N11.

The cathode of the diode DI121 is coupled to the power line PL1. The anode of the diode DI121 is coupled to the power line PL2.

One end of the resistor R11 is coupled to the node N11. The other end of the resistor R11 is coupled to the power line PL2.

A pair of the transistors PM11 and NM11 constitutes the inverter INV11. Specifically, the gate of the transistor PM11 is coupled to the node N11. The source of the transistor PM11 is coupled to the power line PL1. The drain of the transistor PM11 is coupled to a node N12. The body of the transistor PM11 is coupled to the power line PL1. The gate of the transistor NM11 is coupled to the node N11. The source of the transistor NM11 is coupled to the power line PL2. The drain of the transistor NM11 is coupled to the node N12. The body of the transistor NM11 is coupled to the power line PL2. The inverter INV11 inverts the logic level of the node N11, and outputs the inverted level to the node N12.

A pair of the transistors PM12 and NM12 constitutes the inverter INV12. Specifically, the gate of the transistor PM12 is coupled to the node N12. The source of the transistor PM12 is coupled to the power line PL1. The drain of the transistor PM12 is coupled to a node N13. The body of the transistor PM12 is coupled to the power line PL1. The gate of the transistor NM12 is coupled to the node N12. The source of the transistor NM12 is coupled to the power line PL2. The drain of the transistor NM12 is coupled to the node N13. The body of the transistor NM12 is coupled to the power line PL2. The inverter INV12 inverts the logic level of the node N12, and outputs the inverted level to the node N13.

The gate of the transistor NM13 is coupled to the node N13. The source of the transistor NM13 is coupled to the power line PL2. The drain of the transistor NM13 is coupled to the power line PL1. The body of the transistor NM13 is coupled to the power line PL2.

The transistor NM11 is smaller in size than the transistor PM11. The transistor NM12 is smaller in size than the transistor PM12. The transistor PM11 is smaller in size than the transistor PM12. The transistor NM11 is smaller in size than the transistor NM12. The transistor NM12 is smaller in size than the transistor NM13.

The structures of the diodes DI111, DI112, and DI121 are similar to that of the diode DI11 described in the first embodiment. The area of the p-n junction of the diode DI121 is larger than either of the area of the p-n junction of the diode DI111 and the area of the p-n junction of the diode DI112.

Circuit Configuration of Second Comparative Example

FIG. 14 is a circuit diagram showing an example of the circuit configuration of a semiconductor device 14 according to the second comparative example. The semiconductor device 14 is an ESD protective device generally called an RCTMOS. As shown in FIG. 14, the semiconductor device 14 includes a diode DI221, a resistor R21, a capacitor C21, transistors PM21, PM22, and PM23, and transistors NM21, NM22, NM23, and NM24.

The configuration of the semiconductor device 14 according to the second comparative example includes a portion similar to the configuration of the semiconductor device 11 according to the second embodiment and a portion different therefrom. Specifically, the diode DI221, inverters INV22 and INV23, and transistor NM24 included in the semiconductor device 14 correspond to the diode DI21, inverters INV1 and INV2, and transistor NM3 included in the semiconductor device 11, respectively. The semiconductor device 14 includes the resistor R21 and capacitor C21 as well as an inverter INV21. The semiconductor device 11 differs from the semiconductor device 14 in terms of including the diodes DI11 and DI12 and the resistor R1.

The diode DI221 is a p-n junction diode. The forward voltage of the diode DI221 is, for example, 0.7 V. The transistors PM21, PM22, and PM23 are P-type MOSFETs, and the transistors NM21, NM22, NM23, and NM24 are N-type MOSFETs.

The cathode the diode DI221 is coupled to the power line PL1. The anode of the diode DI221 is coupled to the power line PL2.

One end of the resistor R21 is coupled to the power line PL1. The other end of the resistor R21 is coupled to a node N21.

One electrode of the capacitor C21 is coupled to the node N21. The other electrode of the capacitor C21 is coupled to the power line PL2.

A pair of the transistors PM21 and NM21 constitutes the inverter INV21. Specifically, the gate of the transistor PM21 is coupled to the node N21. The source of the transistor PM21 is coupled to the power line PL1. The drain of the transistor PM21 is coupled to a node N22. The body of the transistor PM21 is coupled to the power line PL1. The gate of the transistor NM21 is coupled to the node N21. The source of the transistor NM21 is coupled to the power line PL2. The drain of the transistor NM21 is coupled to the node N22. The body of the transistor NM21 is coupled to the power line PL2. The inverter INV21 inverts the logic level of the node N21, and outputs the inverted level to the node N22.

A pair of the transistors PM22 and NM22 constitutes the inverter INV22. Specifically, the gate of the transistor PM22 is coupled to the node N22. The source of the transistor PM22 is coupled to the power line PL1. The drain of the transistor PM22 is coupled to a node N23. The body of the transistor PM22 is coupled to the power line PL1. The gate of the transistor NM22 is coupled to the node N22. The source of the transistor NM22 is coupled to the power line PL2. The drain of the transistor NM22 is coupled to the node N23. The body of the transistor NM22 is coupled to the power line PL2. The inverter INV22 inverts the logic level of the node N22, and outputs the inverted level to the node N23.

A pair of the transistors PM23 and NM23 constitutes the inverter INV23. Specifically, the gate of the transistor PM23 is coupled to the node N23. The source of the transistor PM23 is coupled to the power line PL1. The drain of the transistor PM23 is coupled to a node N24. The body of the transistor PM23 is coupled to the power line PL1. The gate of the transistor NM23 is coupled to the node N23. The source of the transistor NM23 is coupled to the power line PL2. The drain of the transistor NM23 is coupled to the node N24. The body of the transistor NM23 is coupled to the power line PL2. The inverter INV23 inverts the logic level of the node N23, and outputs the inverted level to the node N24.

The gate of the transistor NM24 is coupled to the node N24. The source of the transistor NM24 is coupled to the power line PL2. The drain of the transistor NM24 is coupled to the power line PL1. The body of the transistor NM24 is coupled to the power line PL2.

The transistor NM21 is smaller in size than the transistor PM21. The transistor PM22 is smaller in size than the transistor NM22. The transistor NM22 is smaller in size than the transistor NM24. The transistor NM23 is smaller in size than the transistor PM23. The transistor NM23 is smaller in size than the transistor NM22.

The structure of the diode DI221 is similar to that of the diode DI11 described in the first embodiment.

[4-2] Conditions for Simulations

Next, specific conditions for simulations will be described.

[4-2-1] Conditions of Various Parameters

For simulations, various parameters were set as follows. Herein, micro (μ) is represented by "u". For example, "um" represents micrometer, and "us" represents microsecond.
(Common Parameters)
Thickness of gate oxide film of each transistor: 5.5 nm. Gate length of each transistor: 0.25 um
Capacitance between power line PL1 and power line PL2: 10 pF
Gate width of transistor that functions as discharge path: 2400 um Since the reference symbol of the transistor that functions as a discharge path varies among embodiments and comparative examples, the gate width of each transistor will be described below.

First Embodiment

Gate width of transistor PM1: 16 um
Gate width of transistor NM1: 42 um
Gate width of transistor PM2: 80 um
Gate width of transistor NM2: 21 um
Gate width of transistor NM3: 2400 um
Floating gate width of each of diodes DI11 and DI12: 10 um
Resistance value of resistor R1: 1 MΩ

The sum of the gate widths of the transistors constituting the driver is 159 um.

Second Embodiment

Floating gate width of diode DI21: 500 um
For the structures common to the first and second embodiments, the same parameters as those used in the first embodiment were used.

First Comparative Example

Gate width of transistor PM11: 32 um
Gate width of transistor NM11: 14 um
Gate width of transistor PM12: 80 um
Gate width of transistor NM12: 35 um
Gate width of transistor NM13: 2400 um
Floating gate width of each of diodes DI111 and DI112: 10 um
Floating gate width of diode DI121: 500 um
Resistance value of resistor R11: 1 MΩ

The size ratio of PMOS to NMOS in each of the inverters INV11 and INV12 is 16 to 7. The sizes of the transistors constituting the inverter INV12 are 2.5 times larger than the sizes of the transistors constituting the inverter INV11. Accordingly, the inverters in the first comparative example have a common parameter relationship in which the parameter of the PMOS transistor is larger than that of the NMOS transistor in each inverter, and the parameters of the second-stage inverter are larger than those of the first-stage inverter.

The sum of the gate widths of the transistors constituting the driver is 161 um. Namely, in simulations, the sum of the gate widths of the driver in each of the first embodiment and second embodiment is nearly equal to the sum of the gate widths of the driver in the first comparative example.

Second Comparative Example

Gate width of transistor PM21: 48 um
Gate width of transistor NM21: 7 um
Gate width of transistor PM22: 16 um
Gate width of transistor NM22: 42 um
Gate width of transistor PM23: 80 um
Gate width of transistor NM23: 21 um
Gate width of transistor NM24: 2400 um
Resistance value of resistor R21: 227 kΩ
Capacitance of capacitor C21: 1 pF
Floating gate width of diode DI221: 500 um The sum of the gate widths of the transistors constituting the driver is 214 um.

[4-2-2] Conditions for Evaluating ESD Susceptibility

Conditions for evaluating ESD susceptibility of each semiconductor device in a simulation will be described. The change in the voltage of the power line PL1 when the power line PL2 is grounded and an ESD is applied to the power line PL1 in each semiconductor device was simulated. As the model of the ESD applied to the power line PL1, a human body model (HBM) or machine model (MM) was used. A simulation was performed using +2 kV or −2 kV in the case of the HMB, and using +200 V or −200 V in the case of the MM. Hereinafter, the voltage of the power line PL1 will be referred to as a "voltage Vdd", and the peak voltage when an ESD is applied will be referred to as "Vdd_peak". The peak voltage is a voltage of the maximum absolute value among the voltages that occur when an ESD is applied.

[4-2-3] Conditions for Evaluating Inrush Current

Conditions for evaluating an inrush current that occurs in each semiconductor device when a power supply voltage is applied in a simulation will be described. Regarding each semiconductor device, the amount of an inrush current that flows into the semiconductor device when a power supply voltage that linearly rises from 0 V to 1.2 V in 1 us to the power line PL1 with the power line PL2 grounded and the power line PL1 at 0 V was simulated. Hereinafter, the current that flows into the power line PL1 will be referred to as a "current Idd", and the maximum value of the inrush current that occurs when a power supply voltage is applied will be referred to as "Idd_peak". The time during which the power supply voltage linearly rises from 0 V to 1.2 V will be referred to as Trise.

The resistance value of the resistor included in the semiconductor device may vary from the set value upon manufacturing. In the case of a resistor using polysilicon, the resistance value may vary, for example, in the range of ±10%. To take this variation into account, a simulation was also performed for the cases where the resistance value of the resistor included in the semiconductor device is changed by 0.9 times and 1.1 times.

[4-3] Results of Simulations

Figures 15, 16:
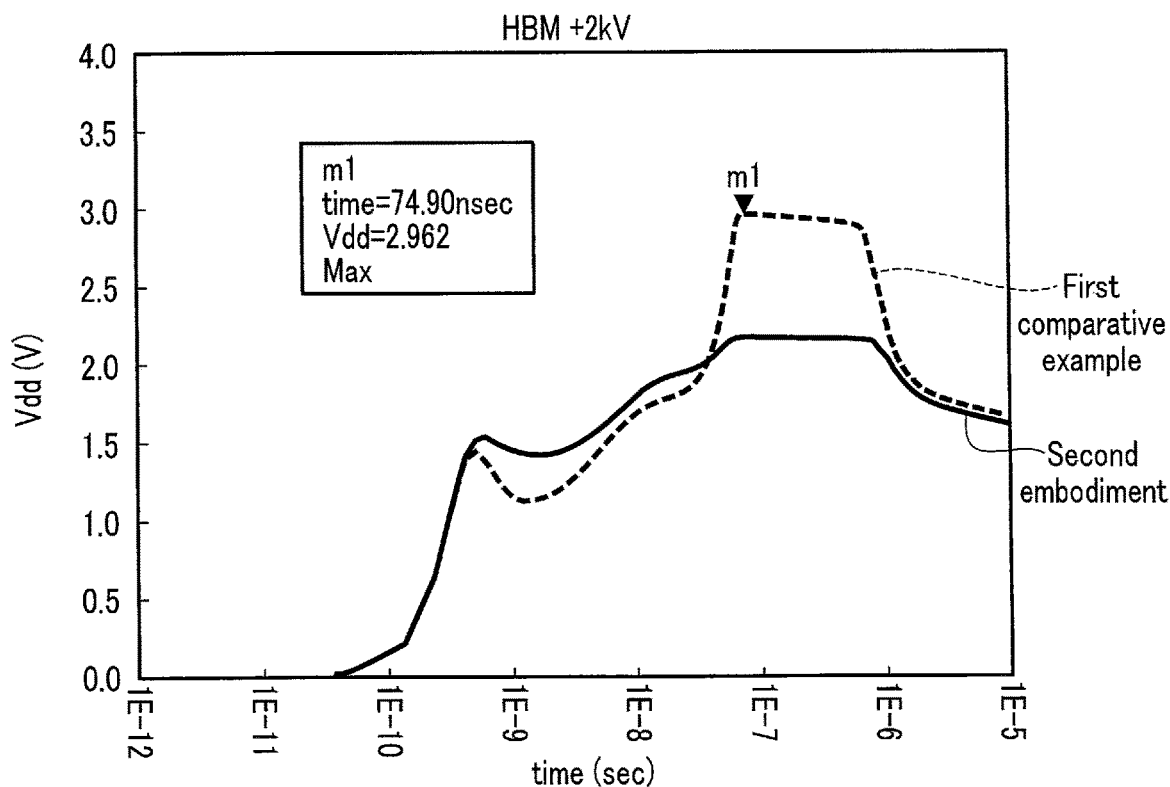
FIG. 15 is a table showing simulation results of the semiconductor devices according to the first embodiment, second embodiment, first comparative example, and second comparative example.
FIG. 16 is a diagram showing simulation results of voltage waveforms when an ESD of HBM and +2 kV was applied in the second embodiment and the first comparative example.

Results of simulations will be described with reference to FIGS. 15 to 21. FIG. 15 is a table showing simulation results of the semiconductor devices according to the first embodiment, second embodiment, first comparative example, and second comparative example. FIG. 15 collectively shows peak values under respective conditions as evaluation results of ESD susceptibility and evaluation results of inrush current. Specifically, as evaluation results of ESD susceptibility, Vdd_peak of each semiconductor device is shown regarding each of the case of the HBM and +2 kV, the case of the HBM and −2 kV, the case of the MM and +200 V, and the case of the MM and −200 V. Vdd_peak is rounded off to two decimal places. As evaluation results of inrush current, Idd_peak of each semiconductor device is shown regarding the case where Trise is 1 us and the resistance value stays unvaried. FIGS. 16 to 21 show examples of simulation results under respective conditions. Hereinafter, simulation results will be described with reference to the values shown in FIG. 15 and examples shown in FIGS. 16 to 21 as appropriate.

(Simulation Results in Case of HBM and +2 kV)

As shown in FIG. 15, Vdd_peak in the case of the HBM and +2 kV was 2.17 V in the first embodiment, 2.17 V in the second embodiment, 2.96 V in the first comparative example, and 2.95 V in the second comparative example. Accordingly, under the condition of the HBM and +2 kV, the peak voltage is suppressed in the cases of the first and second embodiments in comparison with the cases of the first and second comparative examples. Details of the simulation results of the second embodiment and the first comparative example will be described with reference to FIG. 16.

FIG. 16 shows simulation results of voltage waveforms when an ESD of the HBM and +2 kV was applied in the second embodiment and the first comparative example. The horizontal axis of FIG. 16 indicates time with a logarithmic scale. The vertical axis of FIG. 16 indicates voltage. In FIG. 16, the voltage waveform of the second embodiment is shown by a solid line, and that of the first comparative example is shown by a broken line. Vdd_peak of the first comparative example is 2.962 V at 74.90 nsec as indicated by cursor m1. In contrast, Vdd_peak of the second embodiment is 2.17 V; accordingly, the peak voltage is suppressed in comparison with the first comparative example.

In the first and second embodiments, the transistor brought into the on-state when a positive ESD is detected is large in size; therefore, the shunt MOS is quickly turned on, and the peak voltage can be suppressed.

In addition, 159 um, which is the sum of the gate widths of the driver of the first or second embodiment, is nearly equal to 161 um, which is the sum of the gate widths of the driver of the first comparative example. Moreover, the gate width of the transistor that functions as a discharge path in the first or second embodiment is equal to the gate width of the transistor that functions as a discharge path in the first comparative example. Accordingly, the semiconductor devices according to the first and second embodiments can improve the ESD susceptibility without increasing the area on the semiconductor substrate in comparison with the first comparative example.

(Simulation results in Case of HBM and −2 kV)

As shown in FIG. 15, Vdd_peak in the case of the HBM and −2 kV was −3.05 V in the first embodiment, −1.67 V in the second embodiment, −1.68 V in the first comparative example, and −2.07 V in the second comparative example.

Accordingly, under the condition of the HBM and −2 kV, the peak voltage is suppressed in the second embodiment in comparison with the first embodiment. Details of the simulation results of the first embodiment and the second embodiment will be described with reference to FIG. 17.

Figure 17:
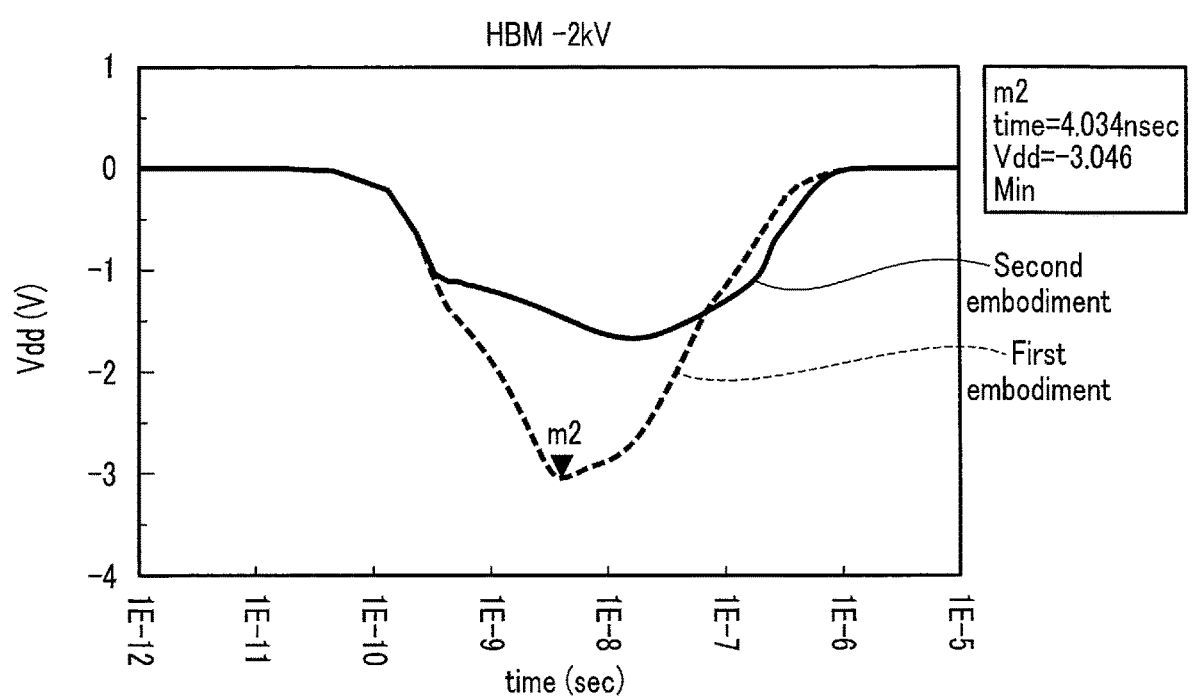
FIG. 17 is a diagram showing simulation results of voltage waveforms when an ESD of HBM and −2 kV was applied in the first embodiment and the second embodiment.

FIG. 17 shows simulation results of voltage waveforms when an ESD of the HBM and −2 kV was applied in the first embodiment and the second embodiment. The horizontal axis of FIG. 17 indicates time with a logarithmic scale. The vertical axis of FIG. 17 indicates voltage. In FIG. 17, the voltage waveform of the second embodiment is shown by a solid line, and that of the first embodiment is shown by a broken line. Vdd_peak of the first embodiment is −3.046 V at 4.034 nsec as indicated by cursor m2. In contrast, Vdd_peak of the second embodiment is −1.67 V; accordingly, the peak voltage is suppressed in comparison with the first embodiment.

Under the condition of the HBM and −2 kV, the voltage of the power line PL1 is a negative voltage; therefore, the diode coupled between the power line PL1 and the power line PL2 functions as a discharge path. In the first embodiment, the diode DI0 parasitic to the transistor NM3 functions as a discharge path; however, the parasitic resistance component of the diode DI0 is large. In the second embodiment, the diode DI21, whose parasitic resistance component is small, functions as a discharge path. Therefore, the second embodiment, in which the parasitic resistance of the discharge path is suppressed, can suppress the peak voltage in comparison with the first embodiment.

(Simulation Results in Case of MM and +200 V)

As shown in FIG. 15, Vdd_peak in the case of the MM and +200 V was 2.97 V in the first embodiment, 2.97 V in the second embodiment, 3.14 V in the first comparative example, and 2.97 V in the second comparative example. Accordingly, under the condition of the MM and +200 V, the peak voltage is suppressed in the first and second embodiments in comparison with the first comparative example. Details of the simulation results in the second embodiment and the first comparative example will be described with reference to FIG. 18.

Figure 18:
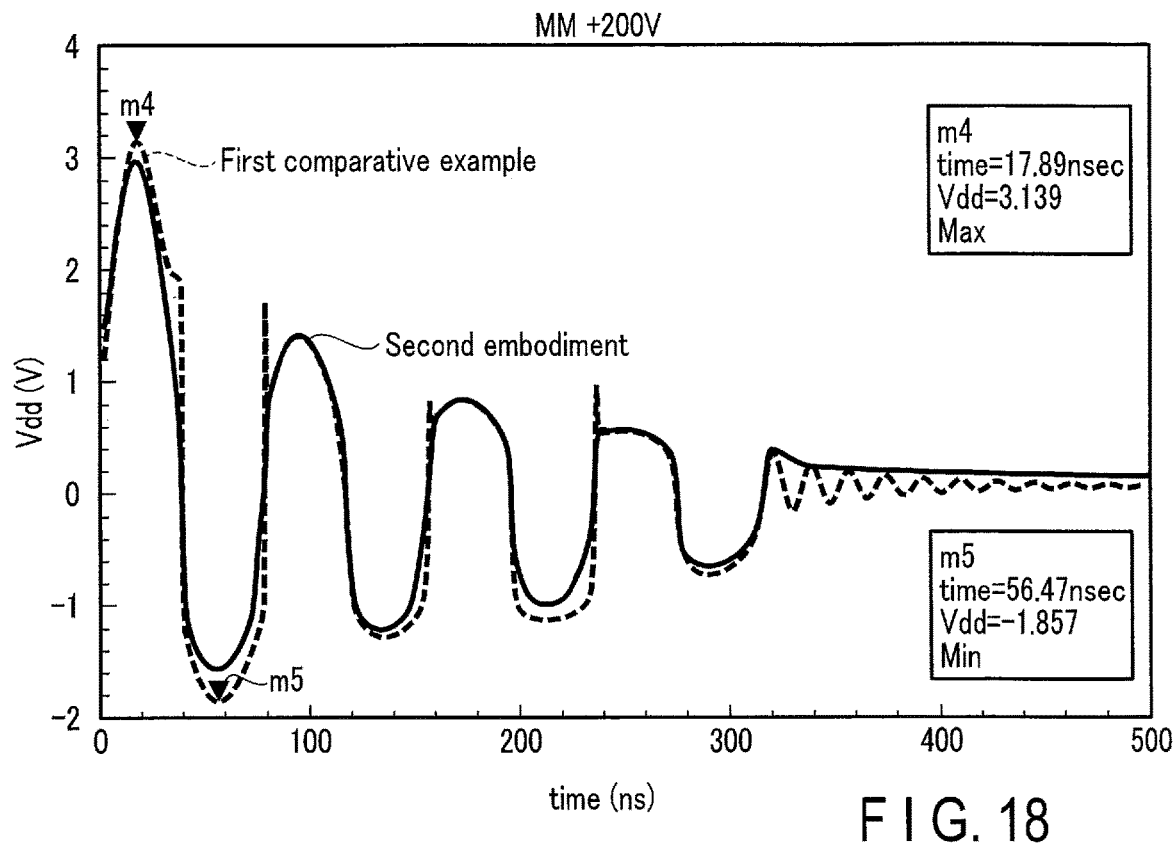
FIG. 18 is a diagram showing simulation results of voltage waveforms when an ESD of MM and +200 V was applied in the second embodiment and the first comparative example.

FIG. 18 shows simulation results of voltage waveforms when an ESD of the MM and +200 V was applied in the second embodiment and the first comparative example. The horizontal axis of FIG. 18 indicates time. The vertical axis of FIG. 18 indicates voltage. In FIG. 18, the voltage waveform of the second embodiment is shown by a solid line, and that of the first comparative example is shown by a broken line. Vdd_peak of the first comparative example is 3.139 V at 17.89 nsec as indicated by cursor m4. In contrast, Vdd_peak of the second embodiment is 2.97 V, and is suppressed. The maximum value of the negative voltage of the first comparative example is −1.857 V at 56.47 nsec as indicated by cursor m5. In contrast, the maximum value of the negative voltage of the second embodiment is more suppressed than the maximum value of the negative voltage of the first comparative example.

When the ESD model is the MM, the voltage that occurs due to the ESD changes to positive or negative. When the ESD model is the MM+, a positive peak first occurs and then, a negative peak occurs. As described for the case of the HMB and +2 kV, the second embodiment can suppress the peak voltage due to a positive ESD more than the first comparative example. Therefore, even in the case of the MM and +200 V, the second embodiment can suppress the peak voltage.

(Simulation Results in Case of MM and −200 V)

As shown in FIG. 15, Vdd_peak in the case of the MM and −200 V was −4.35 V in the first embodiment, −2.18 V in the second embodiment, −2.23 V in the first comparative example, and −2.07 V in the second comparative example. Accordingly, under the condition of the MM and −200 V, the peak voltage is suppressed in the second embodiment in comparison with the first embodiment. Details of the simulation results of the first embodiment and the second embodiment will be described with reference to FIG. 19.

Figure 19:
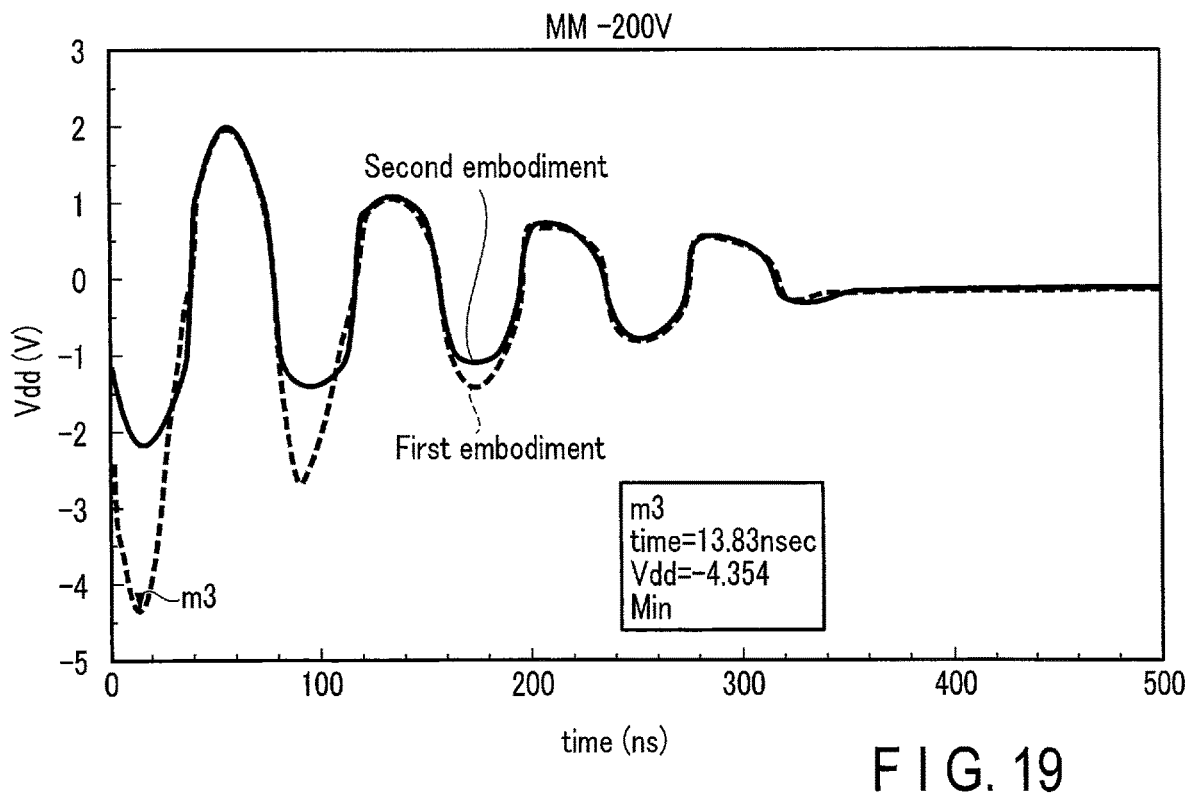
FIG. 19 is a diagram showing simulation results of voltage waveforms when an ESD of MM and −200 V was applied in the first embodiment and the second embodiment.

FIG. 19 shows simulation results of voltage waveforms when an ESD of the MM and −200 V was applied in the first embodiment and the second embodiment. The horizontal axis of FIG. 19 indicates time. The vertical axis of FIG. 19 indicates voltage. In FIG. 19, the voltage waveform of the second embodiment is shown by a solid line, and that of the first embodiment is shown by a broken line. Vdd_peak in the first embodiment is −4.354V V at 13.83 nsec as indicated by cursor m3. In contrast, Vdd_peak of the second embodiment is −2.18 V; accordingly, the peak voltage is suppressed in comparison with the first embodiment.

When the ESD model is the MM-, a negative peak first occurs and then, a positive peak occurs. As described for the case of the HBM and −2 kV, the peak voltage due to a negative ESD can be suppressed in the second embodiment in comparison with the first embodiment. Therefore, even in the case of the MM and −200 V, the second embodiment can suppress the peak voltage.

(Inrush Current)

As shown in FIG. 15, Idd_peak in the case where Trise is 1 us was 31 uA in the first embodiment, 31 uA in the second embodiment, 28 uA in the first comparative example, and 724 uA in the second comparative example. Accordingly, the inrush current is suppressed in the first and second embodiments and first comparative example in comparison with the second comparative example. Details of the simulation results of the second embodiment and the second comparative example will be described with reference to FIG. 20.

FIG. 20 shows simulation results of current waveforms when a power supply voltage was applied in the second embodiment and the second comparative example. FIG. 20 includes a graph (a) showing current waveforms, and a graph (b) showing power supply voltage waveforms. The horizontal axis of the graph (a) showing current waveforms indicates time. The vertical axis of the graph (a) showing current waveforms indicates current with a logarithmic scale. In the graph (a) showing current waveforms, the current waveform of the second embodiment is shown by a solid line, and that of the second comparative example is shown by a broken line. The horizontal axis of the graph (b) showing power supply voltage waveforms indicates time. The vertical axis of the graph (b) showing power supply voltage waveforms indicates voltage. In the graph (b) showing power supply voltage waveforms, the voltage waveforms of the second embodiment and the second comparative example are the same, and are indicated by a solid line. As indicated by the graph (b) showing power supply voltage waveforms, the power supply voltage rises from 0 V to 1.2 V in 1 us (Trise=1 us). The rise in the power supply voltage causes an inrush current; however, Idd_peak of the second embodiment is suppressed to be smaller than Idd_peak of the second comparative example.

In the second comparative example, an RC circuit is used for the detector. The RC circuit detects a rise in the power supply voltage by using an RC time constant. However, when an RC circuit is used for the detector, a rise in the voltage may be detected also in the case where a power supply voltage is applied and the voltage rises from 0 V to the power supply voltage. Therefore, even when a normal power supply voltage is applied, the inrush current may be large.

In contrast, in the second embodiment, a circuit in which diodes and a resistor are coupled in series is used for the detector. In the second embodiment, a rise in the power supply voltage is detected by using the forward voltage of a diode. Therefore, when the voltage is smaller than the forward voltage of the diode, the detector does not detect a rise in the voltage. Accordingly, in the second embodiment, an inrush current is suppressed when a normal power supply voltage is applied. The same applies to the first embodiment and first comparative example, in which the detector has a similar configuration.

(Effects of Variation in Resistance Value)

FIG. 21 is a table showing simulation results when the resistance value varied in the second embodiment and the second comparative example. A simulation of each of the second embodiment and the second comparative example was performed for each of the cases where the resistance value is varied by 0.9 times and 1.1 times and the case where the resistance value is not varied. A simulation was performed to obtain Vdd_peak under the condition of the HBM and +2 kV and Idd_peak under the condition of Trise=1 us. FIG. 21 collectively shows results of these simulations.

As shown in FIG. 21, Vdd_peak of the second embodiment in the case of the HBM and +2 kV was 2.18 V when the resistance variation ratio is 0.9, 2.17 V when the resistance variation ratio is 1, and 2.17 V when the resistance variation ratio is 1.1. Vdd_peak of the second comparative example in the case of the HBM and +2 kV was 3.34 V when the resistance variation ratio is 0.9, 2.95 V when the resistance variation ratio is 1, and 2.59 V when the resistance variation ratio is 1.1. Idd_peak of the second embodiment in the case of Trise=1 us was 30.8 uA when the resistance variation ratio is 0.9, 31.4 uA when the resistance variation ratio is 1, and 31.9 uA when the resistance variation ratio is 1.1. Idd_peak of the second comparative example in the case of Trise=1 us was 143 uA when the resistance variation ratio is 0.9, 724 uA when the resistance variation ratio is 1, and 33127 uA when the resistance variation ratio is 1.1.

In the second comparative example, as the resistance value varied, both Vdd_peak under the condition of the HBM and +2 kV and Idd_peak under the condition of Trise=1 us largely varied. This is because the RC time constant used for detection of an ESD changed in response to the variation of the resistance value.

In the second embodiment, although the resistance value varied, variation of both Vdd_peak under the condition of the HBM and +2 kV and Idd_peak under the condition of Trise=1 us was suppressed. This is because the forward voltages of the diodes used for detection of an ESD do not change even when the resistance value varies. Accordingly, the second embodiment exhibits a higher robustness against variation in the resistance value than the second comparative example. The same applies to the first embodiment and first comparative example, in which the detector has a similar configuration.

[5] Other Modifications, Etc.

Herein, voltages being substantially equal mean that voltages are regarded as substantially equal even when there is a minor voltage difference due to an influence of, for example, an on-resistance of a transistor, leak current, and resistance component of an interconnect.

The configuration of the semiconductor device 20 and operation executed thereby are not limited to the ones described as examples in the embodiments. For example, the semiconductor device 20 may be a radio-frequency power amplifier for amplifying radio-frequency signals transmitted from an antenna, a radio-frequency low-noise amplifier for amplifying weak radio-frequency signals received at an antenna, or a radio-frequency switch for switching a path of radio-frequency signals.

In the embodiments, the case where two diodes (diodes DI11 and DI12) are coupled in series in the detector is described as an example. This is because the power supply voltage of 1.2 V is taken as an example. The number of diodes coupled in series may be changed in accordance with the power supply voltage. For example, when the power supply voltage exceeds 1.2 V, it is preferable to couple three or more diodes in series to make the sum of the forward voltages of the diodes larger than the power supply voltage.

The term "coupling" herein refers to electrical coupling, and does not exclude, for example, the existence of another element between the coupled elements. Further, the expression "electrically coupled" may mean "electrically coupled" even with an insulator interposed in-between, as long as the same operation as that in the case of "electrically coupled" can be ensured. The term "on-state" herein refers to a state in which a voltage higher than or equal to a threshold voltage of a transistor is applied to the gate of the transistor. The term "off-state" refers to a state in which a voltage less than a threshold voltage of a transistor is applied to the gate of the transistor, and does not exclude a state in which a micro-current, such as a leakage current in the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device formed on a silicon on insulator (SOI) substrate including a substrate, an insulating layer provided on the substrate, and a semiconductor layer provided on the insulating layer, the semiconductor device comprising:
   a first power line;
   a second power line;
   a plurality of first diodes coupled in series between the first power line and a first node, with anodes on a first power line side;
   a first resistor coupled between the first node and the second power line;
   a first P-type transistor with a gate coupled to the first node, a source coupled to the first power line, a body coupled to the first power line, and a drain coupled to a second node;
   a first N-type transistor with a gate coupled to the first node, a source coupled to the second power line, a body coupled to the second power line, and a drain coupled to the second node;
   a second P-type transistor with a gate coupled to the second node, a source coupled to the first power line, a body coupled to the first power line, and a drain coupled to a third node;
   a second N-type transistor with a gate coupled to the second node, a source coupled to the second power line, a body coupled to the second power line, and a drain coupled to the third node; and
   a third N-type transistor with a gate coupled to the third node, a source coupled to the second power line, a body coupled to the second power line, and a drain coupled to the first power line, wherein
   a value obtained by dividing a gate width of the first P-type transistor by a gate length thereof is smaller than a value obtained by dividing a gate width of the first N-type transistor by a gate length thereof,
   a value obtained by dividing a gate width of the second N-type transistor by a gate length thereof is smaller than a value obtained by dividing a gate width of the second P-type transistor by a gate length thereof,
   the value obtained by dividing the gate width of the second N-type transistor by the gate length thereof is smaller than the value obtained by dividing the gate width of the first N-type transistor by the gate length thereof,
   the value obtained by dividing the gate width of the first N-type transistor by the gate length thereof is smaller than a value obtained by dividing a gate width of the third N-type transistor by a gate length thereof,
   the semiconductor layer includes:
   a first N-type diffusion region and second N-type diffusion region extending in a first direction and provided adjacent to each other in a second direction which intersects the first direction;
   a third N-type diffusion region extending in the first direction and provided between the first N-type diffusion region and the second N-type diffusion region in the second direction;
   a first P-type diffusion region including a first portion provided between the first N-type diffusion region and the third N-type diffusion region, a second portion provided between the second N-type diffusion region and the third N-type diffusion region, a third portion configured to divide the third N-type diffusion region in the first direction and couple the first portion to the second portion; and
   a second P-type diffusion region surrounded by the third N-type diffusion region and the third portion of the first P-type diffusion region and in contact with the third portion of the first P-type diffusion region in the first direction
   the semiconductor device further comprises:
   a first contact provided on the third N-type diffusion region;
   a second contact provided on the second P-type diffusion region; and
   an interconnect coupled to the first contact and the second contact,
   the first N-type diffusion region and the second N-type diffusion region function as the drain of the third N-type transistor,
   the third N-type diffusion region functions as the source of the third N-type transistor, and
   the P-type diffusion region functions as the body of the third N-type transistor.

2. The semiconductor device according to claim 1, further comprising:
   a second diode with an anode coupled to the second power line and a cathode coupled to the first power line, wherein an area of a p-n junction of each of the first diodes is smaller than an area of a p-n junction of the second diode.

3. The semiconductor device according to claim 1, wherein each of the first and second P-type transistors and the first to third N-type transistors is a fully depleted transistor.

4. The semiconductor device according to claim 1, further comprising:
a signal line;
a third diode with an anode coupled to the signal line and a cathode coupled to the first power line; and
a fourth diode with an anode coupled to the second power line and a cathode coupled to the signal line, wherein
an area of a p-n junction of each of the third and fourth diodes is larger than an area of a p-n junction of each of the first diodes.

5. The semiconductor device according to claim 1, wherein
the semiconductor layer includes a first diffusion region, a third P-type diffusion region in contact with the first diffusion region, and a fourth N-type diffusion region in contact with the first diffusion region,
the semiconductor device further comprises:
an oxide film provided on the first diffusion region; and
a conductor provided on the oxide film,
the third P-type diffusion region and the fourth N-type diffusion region interpose the first diffusion region therebetween,
the first diffusion region is a P-type diffusion region or an N-type diffusion region,
the conductor is in an electrically-floating state, and
a contact surface between the first diffusion region and the third P-type diffusion region or a contact surface between the first diffusion region and the fourth N-type diffusion region functions as part of the first diodes.

6. The semiconductor device according to claim 5, wherein
when the first diffusion region is a P-type diffusion region, a concentration of P-type impurities included in the first diffusion region is lower than a concentration of P-type impurities included in the third P-type diffusion region, and
when the first diffusion region is an N-type diffusion region, a concentration of N-type impurities included in the first diffusion region is lower than a concentration of N-type impurities included in the fourth N-type diffusion region.

7. A semiconductor system comprising:
the semiconductor device according to claim 1;
a first terminal coupled to the first power line;
a second terminal coupled to the second power line; and
a second semiconductor device coupled to the first power line and the second power line and configured to amplify a radio-frequency signal, wherein
the second semiconductor device is operated by a first voltage being applied between the first terminal and the second terminal, and a sum of forward voltages of the first diodes is larger than the first voltage.

8. The semiconductor system according to claim 7, wherein
the semiconductor device further comprises a second diode with an anode coupled to the second power line and a cathode coupled to the first power line, and
an area of a p-n junction of each of the first diodes is smaller than an area of a p-n junction of the second diode.

9. The semiconductor system according to claim 7, wherein each of the first and second P-type transistors and the first to third N-type transistors is a fully depleted transistor.

10. The semiconductor system according to claim 7, wherein
the semiconductor device further comprises:
a signal line;
a third diode with an anode coupled to the signal line and a cathode coupled to the first power line; and
a fourth diode with an anode coupled to the second power line and a cathode coupled to the signal line, and
an area of a p-n junction of each of the third and fourth diodes is larger than an area of a p-n junction of each of the first diodes.

11. The semiconductor system according to claim 7, wherein
the semiconductor layer of the semiconductor device includes a first diffusion region, a third P-type diffusion region in contact with the first diffusion region, and a fourth N-type diffusion region in contact with the first diffusion region,
the semiconductor device further comprises:
an oxide film provided on the first diffusion region; and
a conductor provided on the oxide film,
the third P-type diffusion region and the fourth N-type diffusion region interpose the first diffusion region therebetween,
the first diffusion region is a P-type diffusion region or an N-type diffusion region,
the conductor is in an electrically-floating state, and
a contact surface between the first diffusion region and the third P-type diffusion region or a contact surface between the first diffusion region and the fourth N-type diffusion region functions as part of the first diodes.

12. The semiconductor system according to claim 11, wherein
when the first diffusion region is a P-type diffusion region, a concentration of P-type impurities included in the first diffusion region is lower than a concentration of P-type impurities included in the third P-type diffusion region, and
when the first diffusion region is an N-type diffusion region, a concentration of N-type impurities included in the first diffusion region is lower than a concentration of N-type impurities included in the fourth N-type diffusion region.

* * * * *